US011114351B2

United States Patent
Sasaki et al.

(10) Patent No.: US 11,114,351 B2
(45) Date of Patent: Sep. 7, 2021

(54) DUMMY ELEMENT AND METHOD OF EXAMINING DEFECT OF RESISTIVE ELEMENT

(71) Applicant: FUJI ELECTRIC CO., LTD., Kawasaki (JP)

(72) Inventors: Osamu Sasaki, Azumino (JP); Masaru Saito, Matsumoto (JP); Taichi Karino, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 214 days.

(21) Appl. No.: 16/455,041

(22) Filed: Jun. 27, 2019

(65) Prior Publication Data

US 2020/0051874 A1 Feb. 13, 2020

(30) Foreign Application Priority Data

Aug. 9, 2018 (JP) .............................. JP2018-150311

(51) Int. Cl.
*G01R 31/26* (2020.01)
*H01L 21/66* (2006.01)
*H01L 49/02* (2006.01)

(52) U.S. Cl.
CPC .......... *H01L 22/32* (2013.01); *G01R 31/2637* (2013.01); *G01R 31/2644* (2013.01); *H01L 28/20* (2013.01)

(58) Field of Classification Search
CPC ..... H01L 23/5228; H01L 28/20; H01L 22/14; H01L 22/32; G01R 31/2644; G01R 31/2637; G01R 31/66; G01R 27/08

USPC ...................................................... 324/762.01
See application file for complete search history.

(56) References Cited

U.S. PATENT DOCUMENTS

| | | | | |
|---|---|---|---|---|
| 7,283,182 B2 * | 10/2007 | Sato | ................. | G02F 1/136227 349/44 |
| 7,636,134 B2 * | 12/2009 | Yamasaki | ......... | G02F 1/136213 349/38 |
| 7,685,543 B2 * | 3/2010 | Tsuji | ....................... | G06F 30/36 716/106 |
| 8,148,798 B2 * | 4/2012 | Yamagata | ........... | H01L 27/0688 257/532 |
| 8,531,197 B2 * | 9/2013 | Fefer | ................ | G01R 31/31715 324/750.3 |

(Continued)

FOREIGN PATENT DOCUMENTS

JP 8-306861 A 11/1996

*Primary Examiner* — Christopher P McAndrew

(57) ABSTRACT

A dummy element includes: a semiconductor substrate; a lower insulating film deposited on the semiconductor substrate; a first resistive layer deposited on the lower insulating film; an interlayer insulating film covering the first resistive layer; a first pad-forming electrode deposited on the interlayer insulating film so as to be connected to the first resistive layer, and including an extending portion to be in Schottky contact with the semiconductor substrate; a relay wire connected to the first resistive layer and connected to the semiconductor substrate with an ohmic contact; and a counter electrode allocated under the semiconductor substrate, the dummy element simulating a defective state in the lower insulating film and the interlayer insulating film immediately under the first pad-forming electrode included in a corresponding resistive element as a target to be examined.

16 Claims, 21 Drawing Sheets

(56) References Cited

U.S. PATENT DOCUMENTS

| | | | |
|---|---|---|---|
| 8,604,815 B2* | 12/2013 | Nojima | G01R 31/31924 |
| | | | 324/755.11 |
| 8,664,978 B2* | 3/2014 | Lu | H03K 5/135 |
| | | | 327/43 |
| 8,829,568 B2* | 9/2014 | Ueno | H01L 29/0649 |
| | | | 257/192 |
| 8,835,254 B2* | 9/2014 | Toyoda | H01L 21/823828 |
| | | | 438/259 |
| 9,287,255 B2* | 3/2016 | Zhan | H01L 29/0649 |
| 9,627,486 B2* | 4/2017 | Iwamuro | H01L 29/7811 |
| 9,722,018 B2* | 8/2017 | Iwamuro | H01L 29/66068 |
| 9,786,591 B2* | 10/2017 | Tsai | H01L 23/5226 |
| 9,786,657 B1* | 10/2017 | Dersch | H01L 21/823807 |
| 9,799,732 B2* | 10/2017 | Tsuji | H01L 29/66143 |
| 9,978,857 B2* | 5/2018 | Tsuyuki | H01L 29/0696 |
| 10,263,066 B2* | 4/2019 | Hiroi | H01L 23/5329 |
| 2002/0030226 A1* | 3/2002 | Yasuhara | H01L 29/0692 |
| | | | 257/342 |
| 2003/0200071 A1* | 10/2003 | Zhang | G06F 30/367 |
| | | | 703/15 |
| 2005/0020021 A1* | 1/2005 | Fujiwara | H01L 24/11 |
| | | | 438/303 |
| 2005/0184299 A1* | 8/2005 | Matsumura | H01L 21/28575 |
| | | | 257/79 |
| 2005/0212020 A1* | 9/2005 | Izumi | H01L 27/11507 |
| | | | 257/295 |
| 2008/0224252 A1* | 9/2008 | Suguro | H01L 21/28194 |
| | | | 257/499 |
| 2010/0244870 A1* | 9/2010 | Tanbakuchi | H01L 22/14 |
| | | | 324/755.01 |
| 2012/0112314 A1* | 5/2012 | Jou | H01L 28/60 |
| | | | 257/532 |
| 2018/0076325 A1* | 3/2018 | Tateshita | H01L 27/092 |

* cited by examiner

DUMMY ELEMENT AND METHOD OF EXAMINING DEFECT OF RESISTIVE ELEMENT

CROSS-REFERENCE TO RELATED APPLICATION

This application claims benefit of priority under 35 USC 119 based on Japanese Patent Application No. 2018-150311 filed on Aug. 9, 2018, the entire contents of which are incorporated by reference herein.

BACKGROUND OF THE INVENTION

1. Field of the Invention

The present invention relates to a dummy element for simulating a defective state of a resistive element and a method of examining a defect of a resistive element.

2. Description of the Related Art

JPH08-306861 discloses a resistive element used in a semiconductor integrated circuit (IC), for example, and including a silicon substrate, an insulating layer deposited on the silicon substrate, and a resistive layer of a thin film deposited on the insulating layer. The resistive element disclosed in JPH08-306861 further includes two electrodes at both ends on the top surface of the resistive layer to which bonding wires are bonded. The resistive element with this structure inevitably increases the chip size and requires at least two bonding wires.

In view of such circumstances, a vertical resistive element can be presumed to have a structure in which one end on the top surface of a resistive layer is connected to one electrode, and the other end of the resistive layer is connected to a semiconductor substrate with an ohmic contact via a relay wire so as to flow a current in the vertical direction. The vertical resistive element contributes to reducing the chip size, and also to reducing the number of bonding wires connected to the electrode, as compared with a horizontal resistive element.

For mounting the vertical resistive element, the electrode on the top surface of the resistive layer is partly exposed to define a pad to which the bonding wire is bonded. The pad is required to have a sufficient resistance to wire bonding depending on the diameter or the material of the bonding wire. If the thickness of a metal wire composing the pad or an oxide film immediately under the pad increases to achieve a sufficient resistance to wire bonding, a variation in level on the surface would increase, which may impede fineness or precision in the photoresist processing. Increasing the thickness of the metal wire or the oxide film is thus not a fundamental measure to ensure the resistance to wire bonding.

The wire bonding can cause cracks in the oxide film allocated between the pad and the semiconductor substrate to lead to a short circuit between the pad and the semiconductor substrate. A short circuit between the pad and the semiconductor substrate impedes an exact low resistance, leading a Schottky diode to be connected parallel to the resistive layer. Such a state can highly hinder the detection of failure of the resistive element during a normal operating test after packaging. Thus, a need exists for improving the accuracy of detecting defects during a screening test.

SUMMARY OF THE INVENTION

In view of the foregoing problems, the present invention provides a dummy element for simulating a defective state of a resistive element and a method of examining a defect of a resistive element, enabling a higher accuracy of detecting a defect of a vertical resistive element during a screening test after packaging.

An aspect of the present invention inheres in a dummy element encompassing: a semiconductor substrate; a lower insulating film deposited on the semiconductor substrate; a first resistive layer deposited on the lower insulating film; an interlayer insulating film covering the first resistive layer; a first pad-forming electrode deposited on the interlayer insulating film so as to be connected to the first resistive layer, and including an extending portion to be in Schottky contact with the semiconductor substrate; a relay wire connected to the first resistive layer and connected to the semiconductor substrate with an ohmic contact; and a counter electrode allocated under the semiconductor substrate, the dummy element simulating a defective state in the lower insulating film and the interlayer insulating film immediately under the first pad-forming electrode included in a corresponding resistive element as a target to be examined.

Another aspect of the present invention inheres in a method of examining a defect of a resistive element, using a dummy element including a lower insulating film deposited on a semiconductor substrate, a first resistive layer deposited on the lower insulating film, an interlayer insulating film covering the first resistive layer, a first pad-forming electrode deposited on the interlayer insulating film so as to be connected to the first resistive layer and including an extending portion to be in Schottky contact with the semiconductor substrate, a relay wire connected to the first resistive layer and connected to the semiconductor substrate with an ohmic contact, and a counter electrode allocated under the semiconductor substrate, the method encompassing: measuring an electrical characteristic between the first pad-forming electrode and the counter electrode; measuring an electrical characteristic of the resistive element which is a target to be examined and to be simulated by the dummy element; and examining a defect of a structure included in the resistive element corresponding to the lower insulating film and the interlayer insulating film immediately under the first pad-forming electrode in accordance with a measurement result of the electrical characteristic of each of the dummy element and the resistive element.

DETAILED DESCRIPTION

Figure 1:
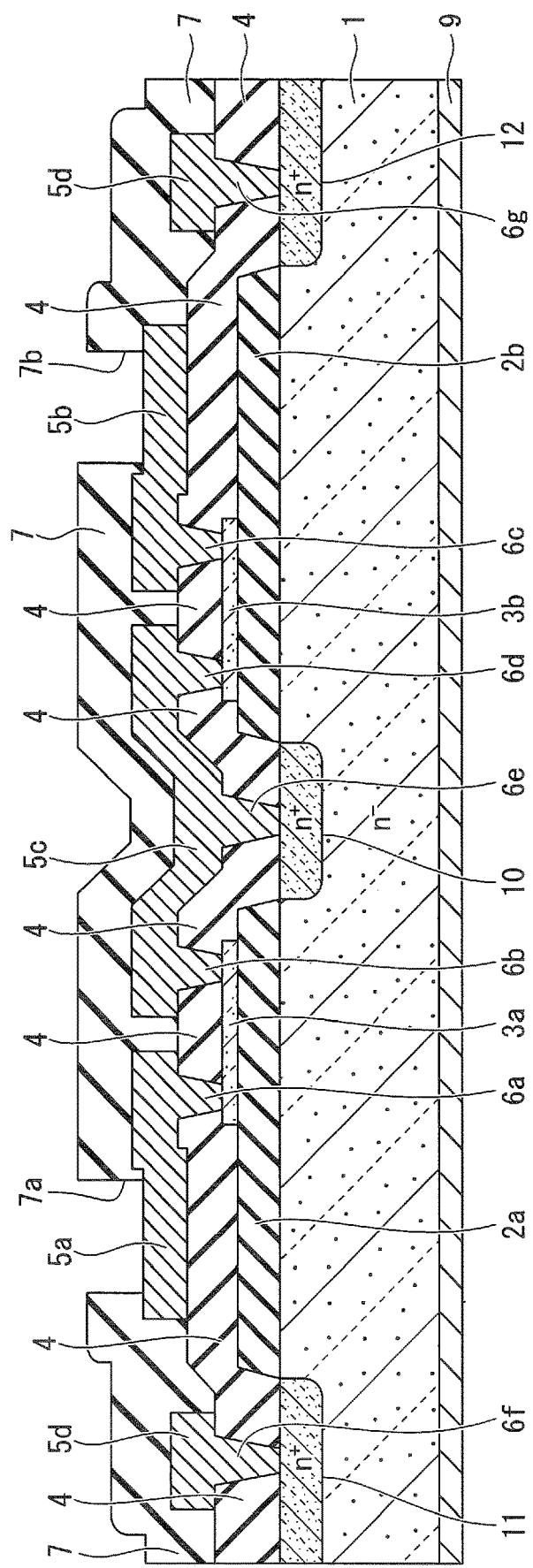
FIG. 1 is a cross-sectional view illustrating a resistive element as a target to be simulated by a dummy element according to an embodiment of the present invention.

With reference to the Drawings, an embodiment of the present invention will be described below. In the Specification and the Drawings, the same or similar elements are indicated by the same or similar reference numerals. The drawings are schematic, and it should be noted that the relationship between thickness and planer dimensions, the thickness proportion of each layer, and the like are different from real ones.

Accordingly, specific thicknesses or dimensions should be determined with reference to the following description. Moreover, in some drawings, portions are illustrated with different dimensional relationships and proportions. The embodiment described below merely illustrate schematically devices and methods for specifying and giving shapes to the technical idea of the present invention, and the span of the technical idea is not limited to materials, shapes, structures, and relative positions of elements described herein.

In addition, in the following description, the definition of the directions such as up and down is merely provided for the convenience of description and does not limit the technical idea of the invention. For example, when an object is rotated by 90 degrees and observed, the direction will be read by changing the up and down to the left and right; and when an object is rotated by 180 degrees and observed, the direction will be read by inverting the up and down. When an object is rotated by 180 degrees and observed, the direction of the front and back will be read by inverting the front and back.

Embodiment

<Resistive Element>

A resistive element (a target element) according to an embodiment of the present invention as a target to be simulated by a dummy element according to the embodiment of the present invention is described below. As illustrated in FIG. 1, the resistive element according to the embodiment of the present invention includes a semiconductor substrate 1 of a first conductivity type (n$^-$-type), a lower insulating film (2a, 2b) deposited on the semiconductor substrate 1, and a first resistive layer 3a and a second resistive layer 3b of thin films deposited on the lower insulating film (2a, 2b). The resistive element according to the embodiment of the present invention is used as a gate resistor for an insulated gate bipolar transistor (IGBT) serving as a main semiconductor device, for example. While the cross-sectional view of FIG. 1 shows the separated lower insulating films indicated by the different reference numerals 2a and 2b, the separated lower insulating films may be a single member integrated on the back side on the paper of FIG. 1.

A thickness of the semiconductor substrate 1 is about 250 to 450 micrometers, for example. The semiconductor substrate 1 may be a silicon (Si) substrate. A contact region (a middle contact region) 10, a contact region (a first peripheral contact region) 11, and a contact region (a second peripheral contact region) 12, each being a first conductivity type (n$^+$-type) and having a higher impurity concentration than the semiconductor substrate 1, are buried at upper portions of the semiconductor substrate 1. Alternatively, a semiconductor substrate 1 of a second conductivity type (p$^-$-type) may be used, and semiconductor regions of a second conductivity type (p$^+$-type) including a middle contact region, a first peripheral contact region, and a second peripheral contact region and having a higher impurity concentration than the semiconductor substrate 1, may be buried at upper portions of the semiconductor substrate 1.

The lower insulating film (2a, 2b) is a field insulating film having a thickness of 600 to 1,000 nanometers, for example. The lower insulating film (2a, 2b) may be a silicon dioxide (SiO$_2$) film, a silicon nitride (Si$_3$N$_4$) film, or a composite film of these films. The lower insulating film (2a, 2b) may be a film deposited by a chemical vapor deposition (CVD) method using gas containing an organic silicon compound such as tetraethoxysilane (TEOS), for example. Increasing the thickness of the lower insulating film (2a, 2b) reduces a parasitic capacitance.

A thickness of the first resistive layer 3a and the second resistive layer 3b is about 400 to 600 nanometers, and a sheet resistance of the first resistive layer 3a and the second resistive layer 3b is about 100 to 200 Ω/sq, for example. The resistivity of the first resistive layer 3a and the second resistive layer 3b can be controlled such that the thickness, the width (in the depth direction in FIG. 1), and the length (in the right-left direction in FIG. 1) of the first resistive layer 3a and the second resistive layer 3b are regulated, and the material included in the first resistive layer 3a and the second resistive layer 3b is selected as appropriate. The first resistive layer 3a and the second resistive layer 3b may include n-type doped polysilicon (DOPOS). The n-type DOPOS can be obtained such that impurity ions such as phosphorus (P) or boron (B) are implanted in polycrystalline silicon (polysilicon), or such that polycrystalline silicon to which impurity ions are added from a gas phase is deposited by a CVD method using doping gas. For the use of DOPOS, the resistivity of the first resistive layer 3a and the second resistive layer 3b can also be controlled such that the amount of impurity ions added to polysilicon is regulated.

The first resistive layer 3a and the second resistive layer 3b preferably have a temperature coefficient of zero or a negative number. Such a temperature coefficient can avoid an increase in the resistivity during operation at a high temperature. The use of the resistive element according to the embodiment of the present invention as a gate resistor for an IGBT can reduce a loss when the IGBT is turned on. The temperature coefficient of DOPOS can be controlled such that a dose of impurity ions implanted in polysilicon is regulated. For example, when the dose is set to about $7.0 \times 10^{15}$ cm$^{-2}$ or less, the temperature coefficient of DOPOS can be set to zero ppm/° C. or lower. The temperature coefficient of the first resistive layer 3a and the second resistive layer 3b is not intended to be limited to zero ppm/° C. or lower. The first resistive layer 3a and the second resistive layer 3b may have a temperature coefficient of a positive number.

The first resistive layer 3a and the second resistive layer 3b are not limited to DOPOS, and may be a nitride film of transition metal such as tantalum nitride (TaN$_x$), or a stacked metallic film having a high melting point and including a chromium (Cr) film, a nickel (Ni) film, and a manganese (Mn) film stacked in this order. Alternatively, the first resistive layer 3a and the second resistive layer 3b may each be a thin film of silver-palladium (AgPd) or ruthenium oxide (RuO$_2$). Alternatively, the first resistive layer 3a and the second resistive layer 3b may be deposited on the semiconductor surface to implement a p-type diffusion layer or an n-type diffusion layer, although such a structure differs from that illustrated in FIG. 1.

An interlayer insulating film 4 is deposited to cover the lower insulating film (2a, 2b), the first resistive layer 3a, and the second resistive layer 3b. A thickness of the interlayer insulating film 4 is about 1,000 to 2,000 nanometers, for example. The interlayer insulating film 4 may be either a single-layer film of a silicon dioxide film without containing impurity ions (a SiO$_2$ film) which is typically referred to as a non-doped silicate glass (NSG) film, a phosphosilicate glass (PSG) film, a borosilicate glass (BSG) film, a borophosphosilicate glass (BPSG) film or a silicon nitride (Si$_3$N$_4$) film, or a composite layer of some of the above films combined together. For example, the interlayer insulating film 4 may be a composite film including a NSG film with a thickness of about 500 to 800 nanometers and a PSG film with a thickness of about 400 to 800 nanometers stacked on one another. The NSG film can decrease a variation in resistance. The PSG film can enhance a resistance to wire bonding.

A pair of a first pad-forming electrode (a first front surface electrode) 5a and a second pad-forming electrode (a second front surface electrode) 5b, and a relay wire 5c are deposited on the interlayer insulating film 4. The first pad-forming electrode 5a is allocated over the lower insulating film 2a, and one end of the first pad-forming electrode 5a overlaps in the depth direction parallel with one end of the first resistive layer 3a. The second pad-forming electrode 5b is allocated over the lower insulating film 2b, and one end of the second pad-forming electrode 5b overlaps in the depth direction parallel with one end of the second resistive layer 3b. The relay wire 5c is interposed between the pair of the first pad-forming electrode 5a and the second pad-forming electrode 5b, and spans over the lower insulating film 2a and the lower insulating film 2b to have a substantially T-shaped structure in cross section.

The first pad-forming electrode 5a is connected to one end of the first resistive layer 3a via a contact region 6a. The other end of the first resistive layer 3a is connected to a resistive layer connection terminal at one of the side ends (a first end) of the relay wire 5c via a contact region 6b. The second pad-forming electrode 5b is connected to one end of the second resistive layer 3b via a contact region 6c. The other end of the second resistive layer 3b is connected to a resistive layer connection terminal at the other side end (a second end) of the relay wire 5c via a contact region 6d. A substrate connection terminal at the middle end (a third end) of the T-shaped relay wire 5c is connected to a middle contact region 10 buried at an upper portion of the semiconductor substrate 1 with an ohmic contact at low contact resistance via a contact region 6e. A counter electrode (a back surface electrode) 9 is allocated on the back surface of the semiconductor substrate 1. The first resistive layer 3a and the second resistive layer 3b are thus connected to the semiconductor substrate 1 in series via the relay wire 5c, so as to implement a vertical resistive element while serving as a resistor between the first pad-forming electrode 5a and the counter electrode 9 opposed to each other, and as a resistor between the second pad-forming electrode 5b and the counter electrode 9 opposed each other.

A thickness of the pair of the first pad-forming electrode 5a and the second pad-forming electrode 5b, and a thickness of the relay wire 5c are each about three micrometers, for example. The pair of the first pad-forming electrode 5a and the second pad-forming electrode 5b, and the relay wire 5c may be a stacked film including a titanium/titanium nitride (Ti/TiN) film with a thickness of about 100 to 130 nanometers serving as barrier metal, an aluminum-silicon (Al—Si) film with a thickness of about three micrometers, and a TiN/Ti film with a thickness of about 35 to 55 nanometers serving as a reflection preventing film. Instead of Al—Si, Al or an Al alloy such as Al—Cu—Si and Al—Cu may be used. The pair of the first pad-forming electrode 5a and the second pad-forming electrode 5b each serve as an electrode pad for output (for mounting). Bonding wires 21 and 22 (refer to FIG. 2) having a diameter of about 200 to 400 micrometers made of metal such as Al are connected to the pair of the first pad-forming electrode 5a and the second pad-forming electrode 5b.

A guard ring layer 5d may be deposited on the interlayer insulating film 4. The guard ring layer 5d includes the same material as the pair of the first pad-forming electrode 5a and the second pad-forming electrode 5b, and the relay wire 5c. The guard ring layer 5d is delineated into a ring shape at an outer periphery of a chip of the resistive element according to the embodiment of the present invention, for example. The guard ring layer 5d is connected to a first peripheral contact region 11 and a second peripheral contact region 12 buried at upper portions of the semiconductor substrate 1 with an ohmic contact via contact regions 6f and 6g.

Although not shown, an active region, such as a semiconductor region of n-type or p-type, may be present in a region inside the guard ring layer 5d to be surrounded by the first peripheral contact region 11 and the second peripheral contact region 12 so as to implement the IGBT as a main semiconductor device. Such a semiconductor region of n-type or p-type implementing the main semiconductor device is not necessarily present in the region inside the guard ring layer 5d, which depends on the design specifications of the chip. For example, the main semiconductor device may be configured as a separate chip. When the main semiconductor device is present in the same chip, the guard ring layer 5d enables the main semiconductor device to have a higher resistance to pressure.

The first peripheral contact region and the second peripheral contact region illustrated in the cross-sectional view of FIG. 1, which are indicated by the different reference numerals 11 and 12, are not necessarily independent of each other, and may be a ring-like diffusion region integrated on the back side on the paper of FIG. 1.

A passivation film 7 is deposited on the pair of the first pad-forming electrode 5a and the second pad-forming electrode 5b, the relay wire 5c, and the guard ring layer 5d. The passivation film 7 prevents moisture from entering from the side surface of the chip. The passivation film 7 may be a composite film including a tetraethoxysilane (TEOS) film including TEOS deposited as raw material gas, a $Si_3N_4$ film, and a polyimide film, which are sequentially stacked. The passivation film 7 is provided with a first window 7a and a second window 7b. The first pad-forming electrode 5a and the second pad-forming electrode 5b are partly exposed to the first window 7a and the second window 7b to define the pad regions for mounting to which the bonding wires 21 and 22 can be bonded (refer to FIG. 2).

Figure 2:
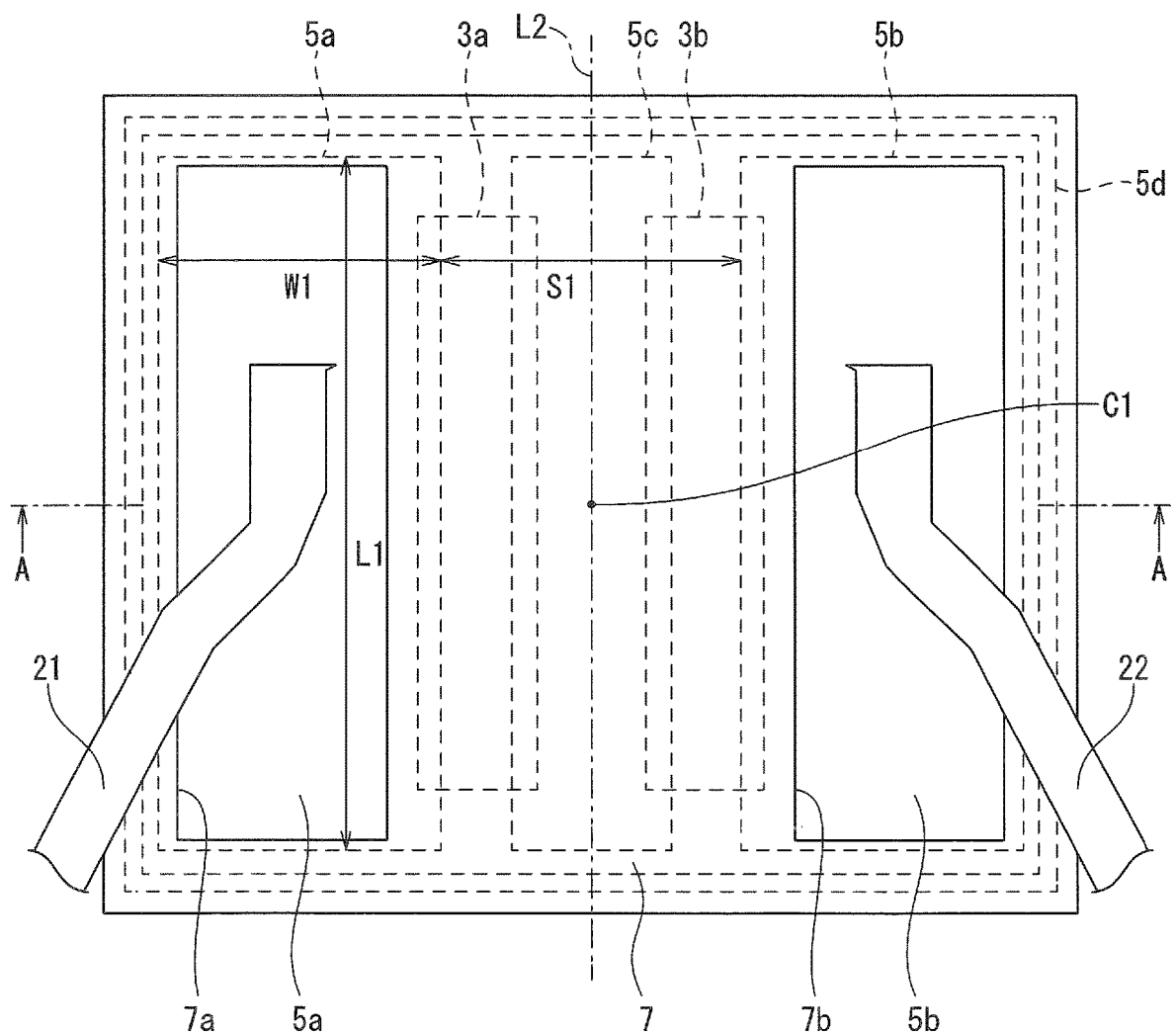
FIG. 2 is a plan view illustrating the resistive element as a target to be simulated by the dummy element according to the embodiment of the present invention.

FIG. 2 is a plan view of the resistive element according to the embodiment of the present invention. FIG. 1 is the cross-sectional view as viewed from direction A-A in FIG. 2. FIG. 2 illustrates the bonding wires 21 and 22 bonded to the pad regions for mounting at which the first pad-forming electrode 5a and the second pad-forming electrode 5b are exposed to the first window 7a and the second window 7b.

The resistive element according to the embodiment of the present invention has a rectangular planar pattern, as illustrated in FIG. 2, defining a direction in which the pair of the first pad-forming electrode 5a and the second pad-forming electrode 5b and the relay wire 5c are arranged as a longitudinal direction. The resistive element according to the embodiment of the present invention has a chip size of about 2.8×2.5 millimeters, for example. As illustrated in FIG. 2, the first pad-forming electrode 5a allocated on the left side has a rectangular planar pattern having a length L1 and a width W1, and the second pad-forming electrode 5b allocated on the right side has a pattern similar to that of the first pad-forming electrode 5a. The first pad-forming electrode 5a and the second pad-forming electrode 5b are arranged in parallel and separated with a space S1. The length L1 of each of the first pad-forming electrode 5a and the second pad-forming electrode 5b is about 2.0 millimeters, the width W1 is about 0.9 millimeters, and the space Si is about 0.5 millimeters or greater, for example. As illustrated in FIG. 2, the first pad-forming electrode 5a, the second pad-forming electrode 5b, and the relay wire 5c each also have a rectangular planar pattern in which the longitudinal direction is the vertical direction in FIG. 2.

The relay wire 5c having a rectangular planar pattern is allocated along the straight line L2 passing through the center C1 of the chip. The first resistive layer 3a, the second resistive layer 3b, the first pad-forming electrode 5a, the second pad-forming electrode 5b, and the relay wire 5c are arranged with line symmetry about the straight line L2 passing through the center C1 of the chip in the planar pattern. The planar pattern including the first resistive layer 3a, the second resistive layer 3b, the first pad-forming electrode 5a, the second pad-forming electrode 5b, and the relay wire 5c has two-fold rotational symmetry about the center C1 of the chip. This arrangement allows the resistive element according to the embodiment of the present invention to be turned by 180 degrees upon packaging, and thus facilitates the process of assembly.

As illustrated in FIG. 1, the counter electrode 9 is allocated on the bottom surface of the semiconductor substrate 1. The counter electrode 9 may be a single film made of gold (Au), or a metallic film including a Ti film, a Ni film and, a Au film stacked in this order. The outermost layer of the counter electrode 9 may be made of material which can be soldered. The counter electrode 9 is fixed to a metallic plate (not shown) by soldering, for example.

The resistive element according to the embodiment of the present invention, as illustrated in FIG. 1, has a fundamental structure in which the resistive layer connection terminals at the two opposed ends of the T-shaped relay wire 5c are connected to the first resistive layer 3a and the second resistive layer 3b. The substrate connection terminal at the middle end of the T-shaped relay wire 5c is connected to the middle contact region 10 buried in the semiconductor substrate 1 with the ohmic contact at low contact resistance so as to implement the vertical resistive element. A single pad region for mounting, which is a part of the first pad-forming electrode 5a connected to the first resistive layer 3a, is thus allotted to the first resistive layer 3a, and a single pad region for mounting, which is a part of the second pad-forming electrode 5b connected to the second resistive layer 3b, is allotted to the second resistive layer 3b. The resistive element according to the embodiment of the present invention thus only requires a single bonding wire for each of the first resistive layer 3a and the second resistive layer 3b, so as to decrease the total number of bonding wires, as compared with a lateral resistive element. Further, the areas of the pad regions for mounting on the top surface can be decreased as compared with a lateral resistive element, thus decreasing the size of the chip accordingly.

When the bonding wires 21 and 22 are bonded to the pad regions for mounting which are defined in the pair of the first pad-forming electrode 5a and the second pad-forming electrode 5b, cracks can be caused in the lower insulating film (2a, 2b) and the interlayer insulting film 4 present between the pads and the semiconductor substrate 1. Cracks caused in the lower insulating film (2a, 2b) and the interlayer insulting film 4 may lead to a short circuit between the pads and the semiconductor substrate 1. A short circuit between the pads and the semiconductor substrate 1 impedes an exact low resistance, leading a Schottky diode to be connected parallel to the first resistive layer 3a and the second resistive layer 3b. Such a state can highly hinder the detection of failure of the resistive element during a normal operating test after packaging, which further requires a screening test. Thus, a need exists for improving the accuracy of detecting defects during the screening test. For the improvement in accuracy of detecting defects during the screening test, the embodiment of the present invention provides a dummy element (a defective sample) for simulating a defective state in which a short circuit is caused between the pads and the semiconductor substrate 1 in the resistive element as illustrated in FIG. 1 and FIG. 2.

<Dummy Element>

Figure 3:
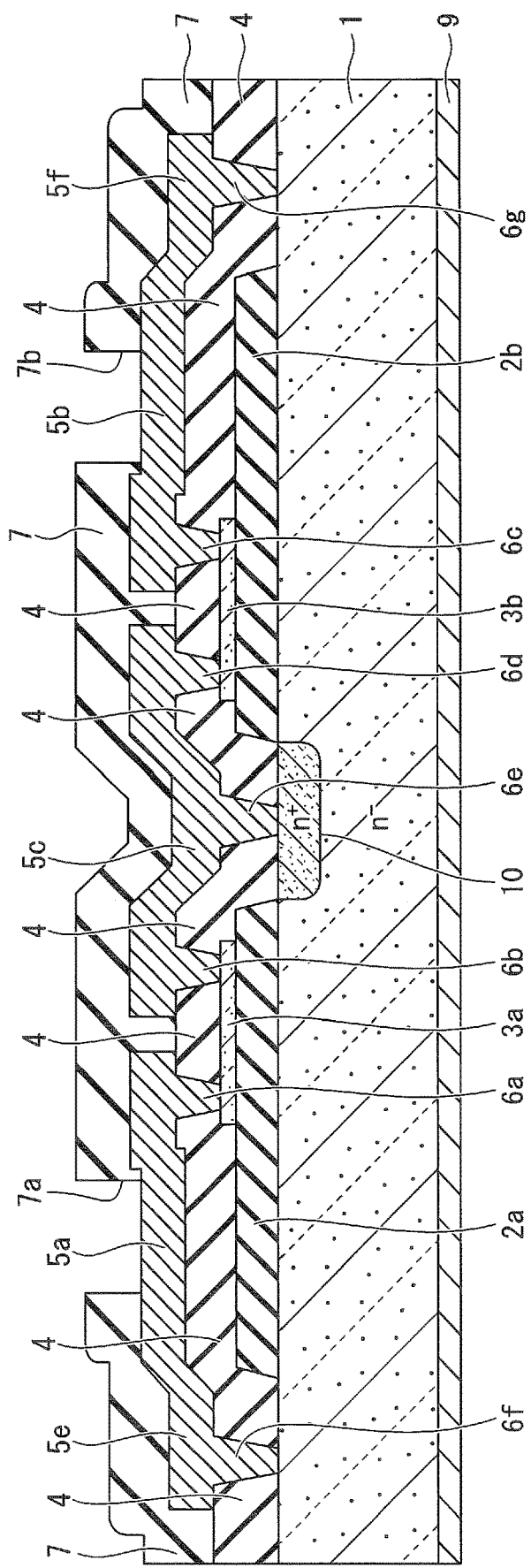
FIG. 3 is a cross-sectional view illustrating the dummy element according to the embodiment of the present invention.

A dummy element according to the embodiment of the present invention simulates a defective state in the lower insulating film (2a, 2b) and the interlayer insulting film 4 immediately under the first pad-forming electrode 5a and the second pad-forming electrode 5b included in the corresponding resistive element as a target to be examined as illustrated in FIG. 1 and FIG. 2. The dummy element according to the embodiment of the present invention, as illustrated in FIG. 3, includes the semiconductor substrate 1, the lower insulating film (2a, 2b) deposited on the semiconductor substrate 1, and the first resistive layer 3a and the second resistive layer 3b of thin films deposited on the lower insulating film (2a, 2b). The configurations of the semiconductor substrate 1, the lower insulating film (2a, 2b), and the first resistive layer 3a and the second resistive layer 3b are the same as the configurations of the semiconductor substrate 1, the lower insulating film (2a, 2b), and the first resistive layer 3a and the second resistive layer 3b in the resistive element as illustrated in FIG. 1 and FIG. 2, and overlapping explanations are not repeated below.

The dummy element includes the same middle contact region 10 of $n^+$-type, as the resistive element illustrated in FIG. 1 and FIG. 2, buried at the upper portion of the semiconductor substrate 1. The dummy element differs from the resistive element illustrated in FIG. 1 and FIG. 2 in that neither the first peripheral contact region 11 nor the second peripheral contact region 12 of $n^+$-type buried at the upper portions of the semiconductor substrate 1 so as to be connected to the guard ring layer 5d, is included in the dummy element.

The interlayer insulating film 4 is deposited to cover the lower insulating film (2a, 2b), the first resistive layer 3a, and the second resistive layer 3b. The pair of the first pad-forming electrode 5a and the second pad-forming electrode 5b, and the relay wire 5c are deposited on the interlayer insulating film 4. The configurations of the interlayer insulating film 4, the first pad-forming electrode 5a, the second pad-forming electrode 5b, and the relay wire 5 are the same as the configurations of the interlayer insulating film 4, the first pad-forming electrode 5a, the second pad-forming electrode 5b, and the relay wire 5 in the resistive element as illustrated in FIG. 1 and FIG. 2.

The first pad-forming electrode 5a is allocated over the lower insulating film 2a, and one end of the first pad-forming electrode 5a overlaps in the depth direction parallel with one end of the first resistive layer 3a. The second pad-forming electrode 5b is allocated over the lower insulating film 2b, and one end of the second pad-forming electrode 5b overlaps in the depth direction parallel with one end of the second resistive layer 3b. The relay wire 5c is interposed between the pair of the first pad-forming electrode 5a and the second pad-forming electrode 5b, and spans over the lower insulating film 2a and the lower insulating film 2b to have a substantially T-shaped structure in cross section.

The first pad-forming electrode 5a is connected to one end of the first resistive layer 3a via the contact region 6a. The other end of the first resistive layer 3a is connected to the resistive layer connection terminal at the left end (the first end) of the T-shaped relay wire 5c via the contact region 6b. The second pad-forming electrode 5b is connected to one end of the second resistive layer 3b via the contact region 6c. The other end of the second resistive layer 3b is connected to the resistive layer connection terminal at the right end (the second end) of the T-shaped relay wire 5c via the contact region 6d. The substrate connection terminal at the middle end (the third end) of the T-shaped relay wire 5c is connected to the semiconductor substrate 1 with an ohmic contact at low contact resistance via the contact region 6e. The counter electrode 9 is allocated on the back side of the semiconductor substrate 1. The first resistive layer 3a is thus connected to the semiconductor substrate 1 in series via the relay wire 5c, so as to implement the vertical resistive element while serving as a resistor between the first pad-forming electrode 5a and the counter electrode 9. Similarly, the second resistive layer 3b is connected to the semiconductor substrate 1 in series via the relay wire 5c, so as to implement the vertical resistive element while serving a resistor between the second pad-forming electrode 5b and the counter electrode 9.

The passivation film 7 is deposited on the pair of the first pad-forming electrode 5a and the second pad-forming electrode 5b, and the relay wire 5c. The passivation film 7 is provided with the first window 7a and the second window 7b. The first pad-forming electrode 5a and the second pad-forming electrode 5b are partly exposed to the first window 7a and the second window 7b to define the pad regions for mounting to which the bonding wires can be bonded. The counter electrode 9 is allocated on the bottom surface of the semiconductor substrate 1.

The dummy element according to the embodiment of the present invention differs from the resistive element illustrated in FIG. 1 and FIG. 2 in that the first pad-forming electrode 5a is integrally connected to an extending portion (a defective dummy wire) 5e which continuously extends from the first pad-forming electrode 5a. The extending portion 5e of the first pad-forming electrode 5a is in Schottky contact with the semiconductor substrate 1 via the contact region 6f. The contact of the first pad-forming electrode 5a with the semiconductor substrate 1 via the extending portion 5e causes a short circuit between the first pad-forming electrode 5a and the semiconductor substrate 1 so as to simulate the Schottky contact state. In particular, the wire bonding causes cracks in the lower insulating film 2a and the interlayer insulating film 4 immediately under the first pad-forming electrode 5a to lead to a short circuit between the first pad-forming electrode 5a and the semiconductor substrate 1, which corresponds to the state of the Schottky contact of the extending portion 5e with the semiconductor substrate 1. The size or the number of the contact region 6f can be regulated so as to adjust the Schottky contact area as appropriate.

The dummy element according to the embodiment of the present invention further differs from the resistive element illustrated in FIG. 1 and FIG. 2 in that the second pad-forming electrode 5b is integrally connected to an extending portion (a defective dummy wire) 5f which continuously extends from the second pad-forming electrode 5b. The extending portion 5f of the second pad-forming electrode 5b is in Schottky contact with the semiconductor substrate 1 via the contact region 6g. The Schottky contact of the second pad-forming electrode 5b with the semiconductor substrate 1 via the extending portion 5f can simulate a state of a short circuit between the second pad-forming electrode 5b and the semiconductor substrate 1. Namely, the state in which cracks are caused in the lower insulating film 2b and the interlayer insulating film 4 immediately under the second pad-forming electrode 5b during the wire bonding to lead to a short circuit between the second pad-forming electrode 5b and the semiconductor substrate 1, corresponds to the Schottky contact state. The size or the number of the contact region 6g can be regulated so as to adjust the Schottky contact area as appropriate.

Figure 4:
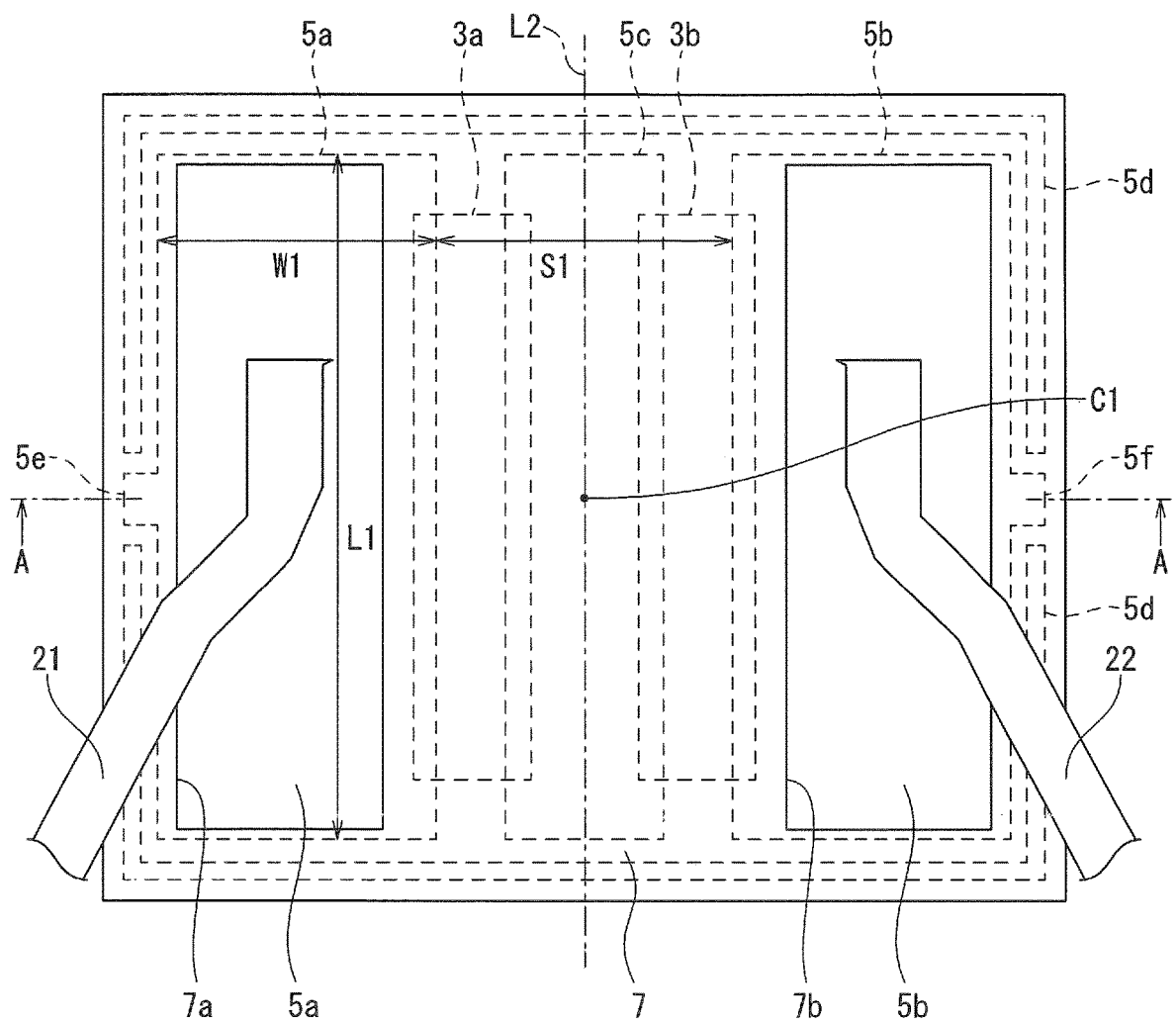
FIG. 4 is a plan view illustrating the dummy element according to the embodiment of the present invention.

FIG. 4 is a plan view of the dummy element according to the embodiment of the present invention. FIG. 3 is the cross-sectional view as viewed from direction A-A in FIG. 4. Although FIG. 4 schematically illustrates the bonding wires 21 and 22 bonded to the pad regions for mounting defined in the first pad-forming electrode 5a and the second pad-forming electrode 5b, the bonding wires 21 and 22 are not necessarily bonded during the process of examining a defect (measuring electrical characteristics) of the resistive element according to the embodiment of the present invention described below.

The planar pattern of the dummy element according to the embodiment of the present invention is substantially the same as that of the resistive element as illustrated in FIG. 2. The dummy element differs from the resistive element illustrated in FIG. 2 in that the guard ring layer 5d is partly divided. The extending portions 5e and 5f, which are the projections of the first pad-forming electrode 5a and the second pad-forming electrode 5b, are allocated at the divided portions of the guard ring layer 5d. The extending portions 5e and 5f having a shape determined as appropriate are preferably, but not necessarily, arranged adjacent to the bonded positions of the bonding wires 21 and 22.

<Method of Examining Defect of Resistive Element>

A method of examining a defect of the resistive element (a screening method) according to the embodiment of the present invention using the dummy element according to the embodiment of the present invention is illustrated below. First, the electrical characteristics between the first pad-forming electrode 5a and the counter electrode 9 or between the second pad-forming electrode 5b and the counter electrode 9 illustrated in FIG. 3 are measured by use of the dummy element according to the embodiment of the present invention. Similarly, the electrical characteristics between the first pad-forming electrode 5a and the counter electrode 9 or between the second pad-forming electrode 5b and the counter electrode 9 illustrated in FIG. 1 are measured by use of the resistive element according to the embodiment of the present invention. Thereafter, a defect of the resistive element according to the embodiment of the present invention is examined in accordance with the measurement results of the dummy element according to the embodiment of the present invention and the measurement results of the resistive element according to the embodiment of the present invention. Since the dummy element according to the embodiment of the present invention simulates a defective state of the resistive element according to the embodiment of the present invention, the measurement results of the dummy element according to the embodiment of the present invention can be similar to the measurement results in the defective state of the resistive element according to the embodiment of the present invention. The defect of the resistive element according to the embodiment of the present invention thus can be detected with high accuracy based on the correlation with the measurement results of the dummy element according to the embodiment of the present invention.

Figure 5:
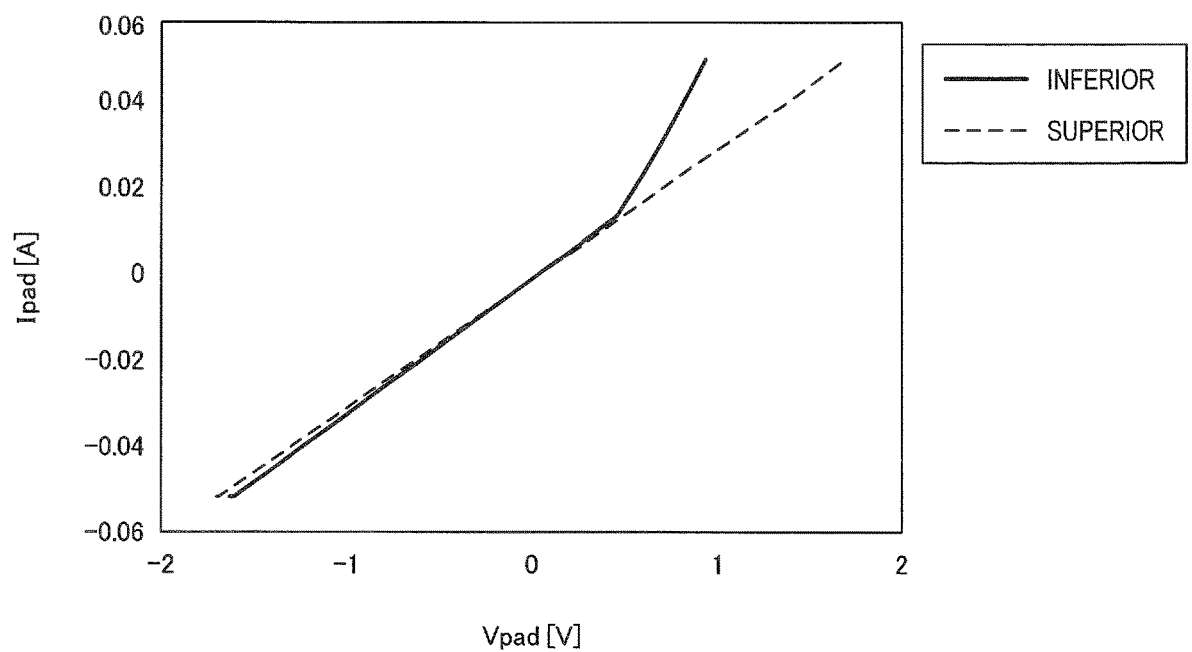
FIG. 5 is a graph showing I-V measurement results of the resistive element according to the embodiment of the present invention.

The defect of the resistive element according to the embodiment of the present invention may be examined such that I-V characteristics are measured as the electrical characteristics of the dummy element and the resistive element according to the embodiment of the present invention. FIG. 5 is a graph showing the measurement results of the I-V characteristics in each of the cases in which the resistive element according to the embodiment of the present invention is superior and inferior. The dummy element according to the embodiment of the present invention can be configured such that the measurement results of the dummy element have a profile similar to that of the measurement results of the resistive element according to the embodiment of the present invention in the case of being inferior.

Figure 6:
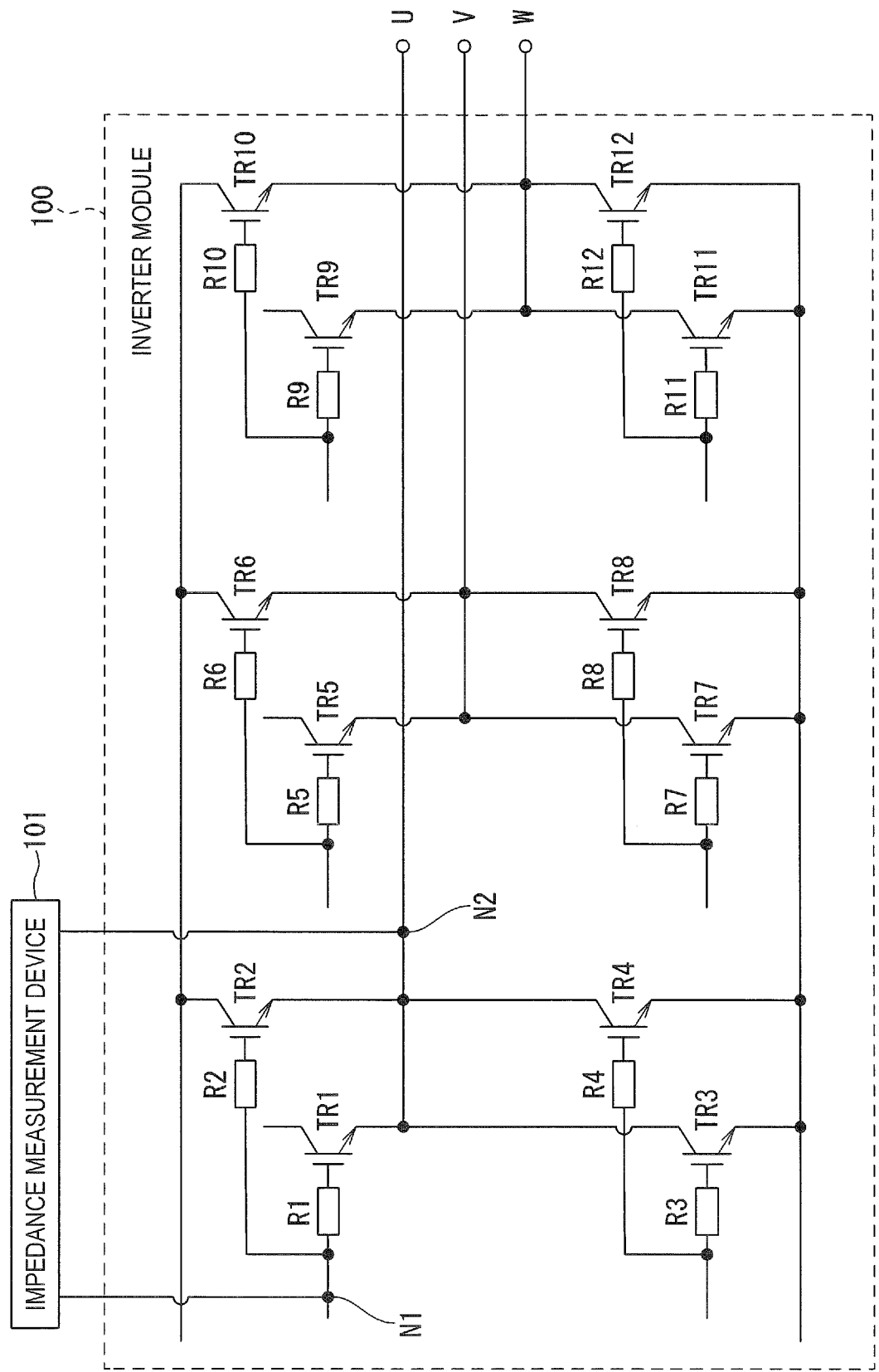
FIG. 6 is a schematic diagram upon measurement of impedance of the dummy element and the resistive element according to the embodiment of the present invention.

Alternatively, the defect of the resistive element according to the embodiment of the present invention may be examined such that impedance is measured as the electrical characteristics of the dummy element and the resistive element according to the embodiment of the present invention. The dummy element and the resistive element according to the embodiment of the present invention can be used for an inverter module 100 for driving a three-phase motor having a u-phase, a v-phase, and a w-phase, for example, as illustrated in FIG. 6. The inverter module 100 includes power semiconductor devices TR1, TR2, TR3, and TR4 for driving the u-phase, power semiconductor devices TR5, TR6, TR7, and TR8 for driving the v-phase, and power semiconductor devices TR9, TR10, TR11, and TR12 for driving the w-phase. The power semiconductor devices TR1 to TR12 are each connected to a freewheeling diode (not shown). The power semiconductor devices TR1 to TR12 may be IGBTs, and gate electrodes of the IGBTs are connected to gate resistors R1 to R12 in order to suppress an oscillation phenomenon upon switching operation.

The dummy element and the resistive element according to the embodiment of the present invention can be used to serve as each of the pair of the gate resistors R1 and R2, the pair of the gate resistors R3 and R4, the pair of the gate resistors R5 and R6, the pair of the gate resistors R7 and R8, the pair of the gate resistors R9 and R10, and the pair of the gate resistors R11 and R12. For example, the first resistive layer 3a and the second resistive layer 3b illustrated in FIG. 1 and FIG. 3 correspond to the gate resistors R1 and R2. The terminal on the side on which the gate resistors R1 and R2 are connected to the gate electrodes of the power semiconductor devices TR1 and TR2 corresponds to the terminal toward the pair of the first pad-forming electrode 5a and the second pad-forming electrode 5b illustrated in FIG. 1 and FIG. 3. The terminal on the side opposite to the side on which the gate resistors R1 and R2 are connected to the gate electrodes of the power semiconductor devices TR1 and TR2 corresponds to the terminal toward the second electrode 9 illustrated in FIG. 1 and FIG. 3.

The impedance is measured in the inverter module 100 illustrated in FIG. 6 for six groups: a group of the pair of the gate resistors R1 and R2 and the semiconductor devices TR1 and TR2, a group of the pair of the gate resistors R3 and R4 and the semiconductor devices TR3 and TR4, a group of the pair of the gate resistors R5 and R6 and the semiconductor devices TR5 and TR6, a group of the pair of the gate resistors R7 and R8 and the semiconductor devices TR7 and TR8, a group of the pair of the gate resistors R9 and R10 and the semiconductor devices TR9 and TR10, and a group of the pair of the gate resistors R11 and R12 and the semiconductor devices TR11 and TR12.

For the group of the pair of the gate resistors R1 and R2 and the semiconductor devices TR1 and TR2, for example, the pair of the gate resistances R1 and R2 are integrated in a single resistor chip (R1, R2), and the semiconductor devices TR1 and TR2 are integrated in a single IGBT chip (TR1, TR2), so that the resistor chip (R1, R2) and the IGBT chip (TR1, TR2) are mounted on a substrate. The resistor chip (R1, R2) and the IGBT chip (TR1, TR2) are connected together via wires, and an impedance between the terminal N1 on the back surface of the resistor chip (R1, R2) and the terminal N2 on the back surface of the IGBT chip (TR1, TR2) is then measured with an impedance measurement device 101, so as to determines a presence or absence of leakage in a pad according to amplitude-voltage dependence. For example, the amplitude voltage [V] may be measured under at least two different conditions so as to be screened by use of a difference between the measured values. In particular, the impedance may be measured under the two conditions of the amplitude voltage of five voltages or lower (such as four voltages) and ten voltages or greater (such as 20 voltages), for example.

Figure 7:
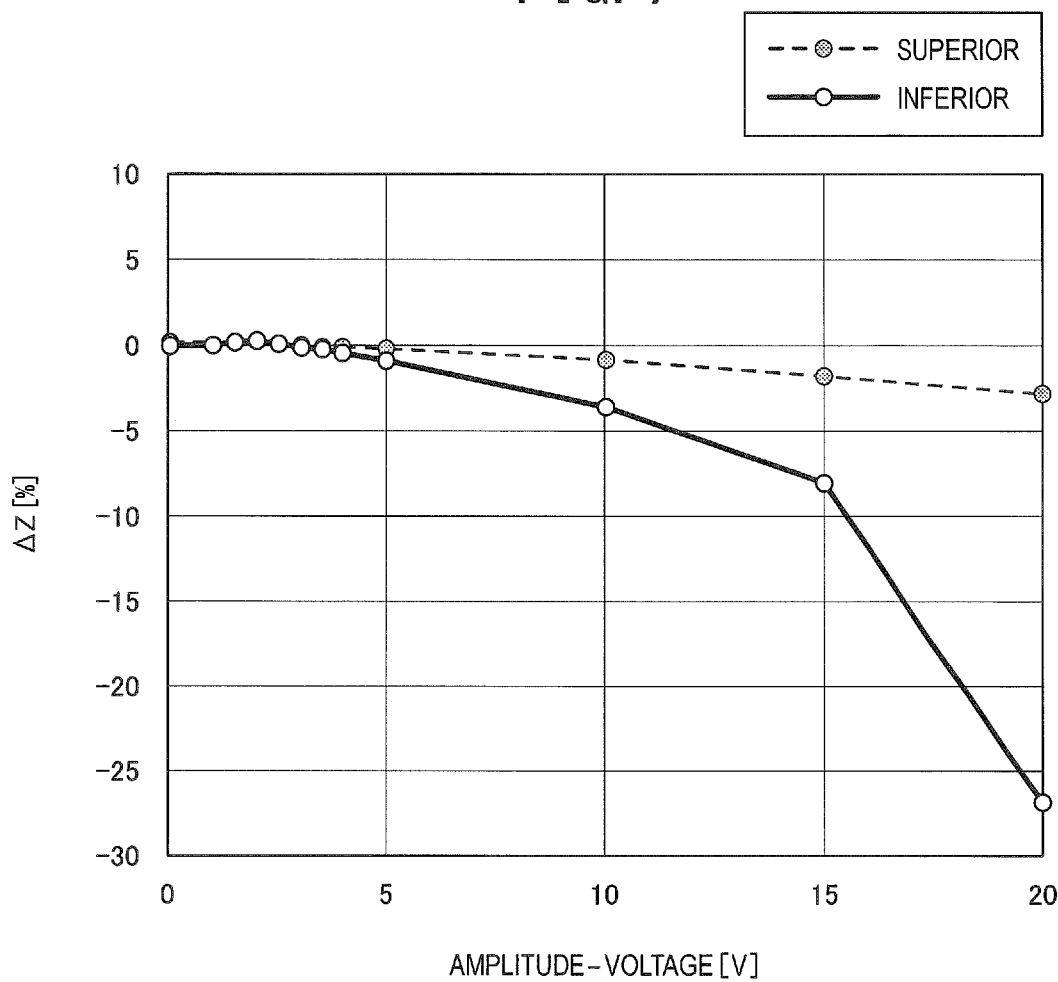
FIG. 7 is a graph showing impedance measurement results of the resistive element according to the embodiment of the present invention.

FIG. 7 is a graph showing curves which indicate a variation in impedance AZ [%] in each of the cases in which the resistive element according to the embodiment of the present invention is superior and inferior. The dummy element according to the embodiment of the present invention can be configured such that the measurement results of the dummy element have a profile similar to that of the measurement results of the resistive element according to the embodiment of the present invention in the case of being inferior.

The dummy element according to the embodiment of the present invention described above can simulate (actualize) damage to the resistive element according to the embodiment of the present invention caused by the wire bonding. The dummy element thus can improve the accuracy of detecting a defect of the resistive element according to the embodiment of the present invention during the screening test after wire bonding (packaging).

<Method of Manufacturing Resistive Element>

A method of manufacturing the dummy element according to the embodiment of the present invention is illustrated below with reference to FIG. 8 to FIG. 18. It should be understood that the method of manufacturing the dummy element and the exemplified values and materials described below are mere examples, and the embodiment of the present invention can be implemented by various methods other than the following method including modified examples within the scope of the invention as defined by the appended claims.

Figure 8:
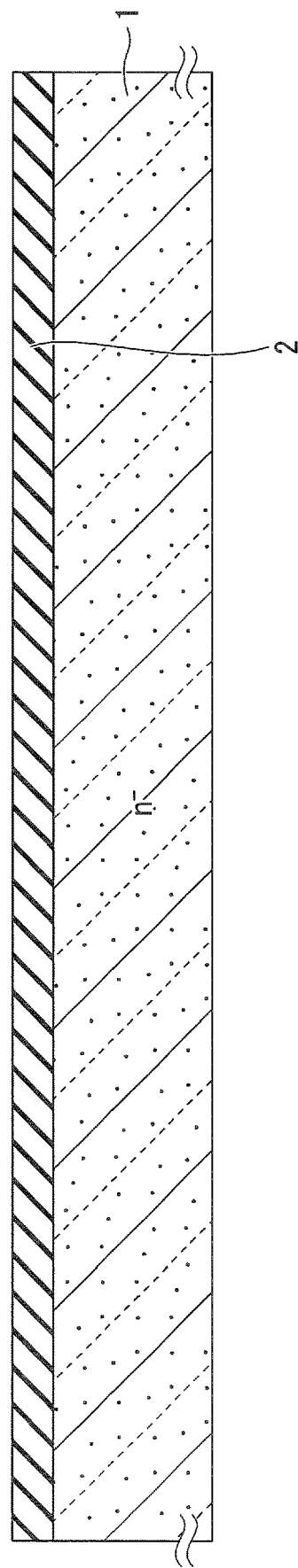
FIG. 8 is a cross-sectional view illustrating a process of manufacturing the dummy element according to the embodiment of the present invention.
Figure 9:
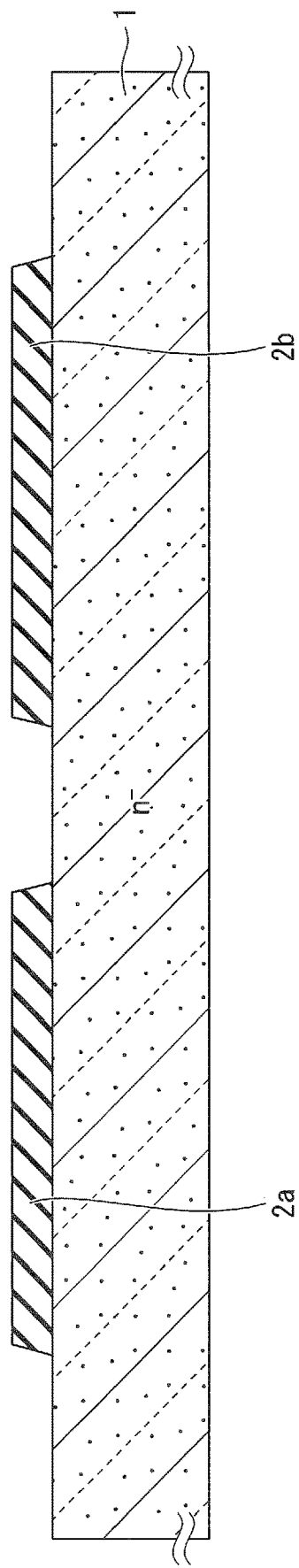
FIG. 9 is a cross-sectional view, continued from FIG. 8, illustrating the process of manufacturing the dummy element according to the embodiment of the present invention.
Figure 10:
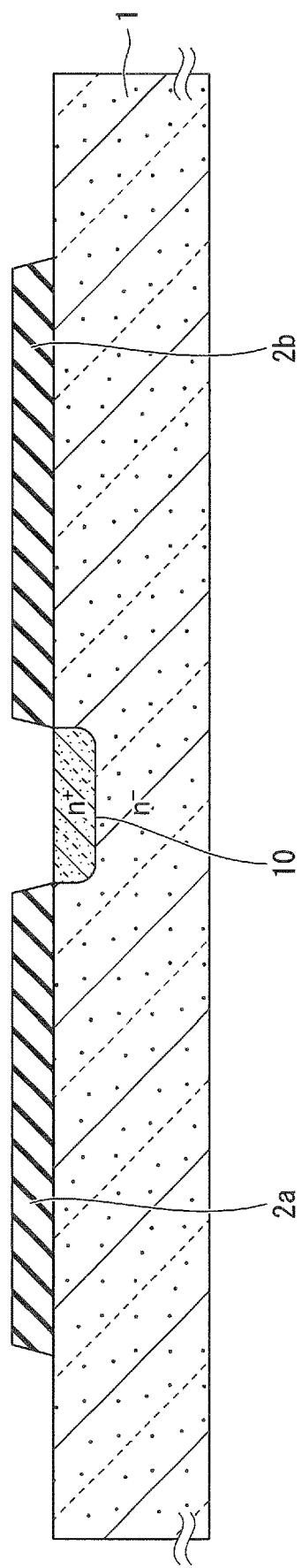
FIG. 10 is a cross-sectional view, continued from FIG. 9, illustrating the process of manufacturing the dummy element according to the embodiment of the present invention.

First, the semiconductor substrate 1, such as a silicon substrate of n⁻-type, is prepared. As illustrated in FIG. 8, the lower insulating film 2 such as a TEOS film is deposited on the semiconductor substrate 1 by a low-pressure chemical vapor deposition (LPCVD) method, for example. The lower insulating film 2 may be a composite film including a thermal oxide film and an insulating film obtained such that the thermal oxide film is formed by a thermal oxidation method, and the insulating film is then deposited on the thermal oxide film by a CVD method. A photoresist film is then coated on the top surface of the first insulating film 2, and is delineated by photolithography. Using the delineated photoresist film as an etching mask, a part of the first insulating film 2 is selectively removed by dry etching such as reactive ion etching (RIE). The photoresist film is then removed, so as to partly form the lower insulating film (2a, 2b) on the top surface of the semiconductor substrate 1, as illustrated in FIG. 9. A method of manufacturing the resistive element illustrated in FIG. 1 and FIG. 2 includes the same steps as illustrated in FIG. 8 and FIG. 9. While FIG. 10 illustrates the separated "lower insulating films" indicated by the different reference numerals 2a and 2b, the separated lower insulating films may be integrated on the back side on the paper of FIG. 10. The cross-sectional view of FIG. 10 shows an opening provided in the middle of the continuous lower insulating film.

Next, a photoresist film is coated on the semiconductor substrate 1 and the lower insulating film (2a, 2b), and is delineated by photolithography. Using the delineated photoresist film as a mask for ion implantation, n-type impurity ions such as phosphorus (P) are selectively implanted in the photoresist film. After the photoresist film used as the mask for ion implantation is removed, the n-type impurity ions are activated by annealing, thus providing the middle contact region 10 of n⁺-type at the upper portion of the semiconductor substrate 1, as illustrated in FIG. 10. Although not shown, the semiconductor region of n⁺-type as illustrated in FIG. 4, which is located on the back side on the paper of FIG. 10, is formed simultaneously with the middle contact region 10 at the peripheral portion of the semiconductor substrate 1. The method of manufacturing the resistive element illustrated in FIG. 1 includes the step, corresponding to the manufacturing step illustrated in FIG. 10, of forming a ring-like region of the first peripheral contact region 11 and the second peripheral contact region 12 of n⁺-type integrated together at the peripheral portion of the semiconductor substrate 1 simultaneously with the middle contact region 10. The first peripheral contact region 11 and the second peripheral contact region 12 thus appear in FIG. 10 for the manufacturing method for the resistive element.

Figure 11:
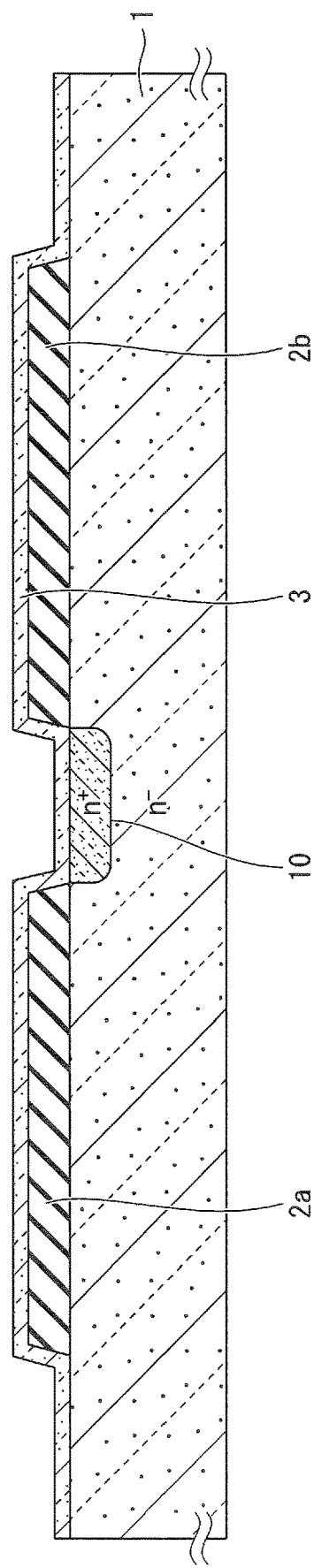
FIG. 11 is a cross-sectional view, continued from FIG. 10, illustrating the process of manufacturing the dummy element according to the embodiment of the present invention.
Figure 12:
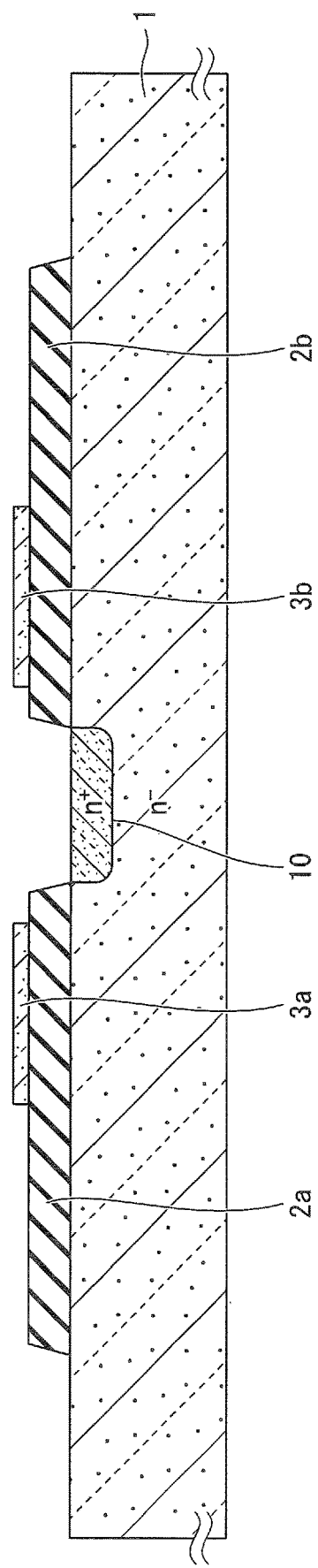
FIG. 12 is a cross-sectional view, continued from FIG. 11, illustrating the process of manufacturing the dummy element according to the embodiment of the present invention.

Next, a non-doped polysilicon layer is formed on the semiconductor substrate 1 and the lower insulating film (2a, 2b) by a CVD method, for example. N-type impurity ions such as phosphorus (P) are implanted in the polysilicon layer. For example, P impurity ions are implanted under the conditions of an acceleration voltage of 80 keV and a dose of about $6.0 \times 10^{15}$ cm$^{-2}$ or less. The impurity ions implanted are activated by annealing, so as to entirely form the DOPOS layer 3 doped with the highly-concentrated n-type impurity ions, as illustrated in FIG. 11. A photoresist film is then coated on the top surface of the DOPOS film 3, and is delineated by photolithography. Using the delineated photoresist film as an etching mask, a part of the DOPOS layer 3 is selectively removed by RIE, for example. The photoresist film is then removed, so as to form the first resistive layer 3a and the second resistive layer 3b on the lower insulating film (2a, 2b), as illustrated in FIG. 12. The method of manufacturing the resistive element illustrated in FIG. 1 and FIG. 2 includes the same steps as illustrated in FIG. 11 and FIG. 12.

Figure 13:
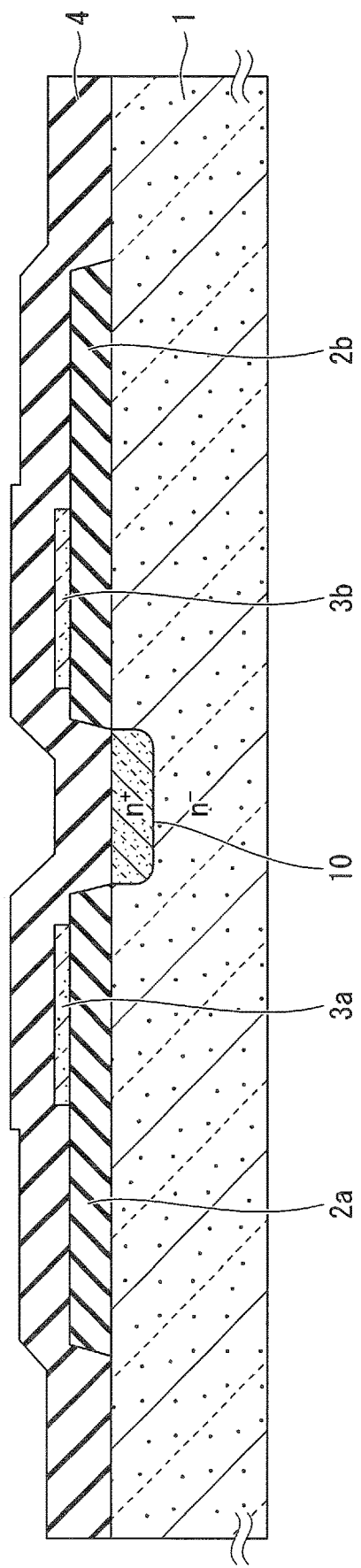
FIG. 13 is a cross-sectional view, continued from FIG. 12, illustrating the process of manufacturing the dummy element according to the embodiment of the present invention.
Figure 14:
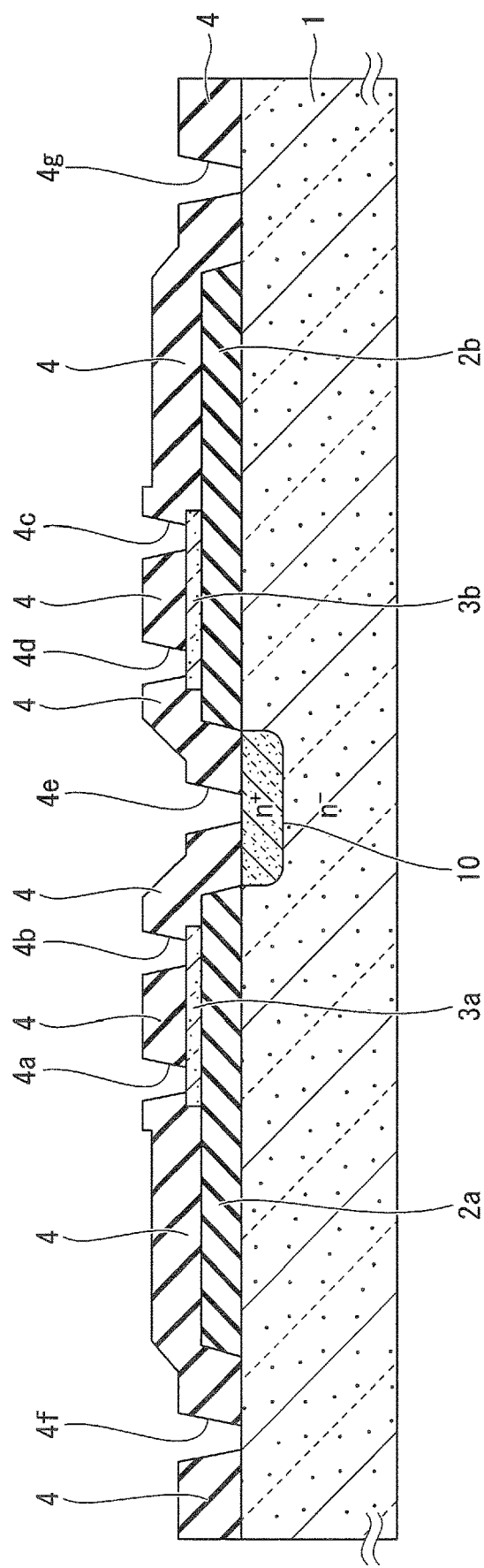
FIG. 14 is a cross-sectional view, continued from FIG. 13, illustrating the process of manufacturing the dummy element according to the embodiment of the present invention.

Next, as illustrated in FIG. 13, the interlayer insulating film 4 is deposited to cover the lower insulating film (2a, 2b), the first resistive layer 3a, and the second resistive layer 3b. The interlayer insulating film 4 may be made of a composite film including a NSG film and a PSG film sequentially stacked by a CVD method, for example. A photoresist film is then coated on the interlayer insulating film 4, and is delineated by photolithography. Using the delineated photoresist film as an etching mask, a part of the interlayer insulating film 4 is selectively removed by RIE, for example. The photoresist film is then removed, so as to open a first contact hole 4a, a second contact hole 4b, a third contact hole 4c, a fourth contact hole 4d, and a fifth contact hole 4e in the interlayer insulating film 4, as illustrated in FIG. 14. The interlayer insulating film 4 is simultaneously provided with other contact holes such as a sixth contact hole 4f and a seventh contact hole 4g. The method of manufacturing the resistive element illustrated in FIG. 1 and FIG. 2 includes the same steps as illustrated in FIG. 13 and FIG. 14.

Figure 15:
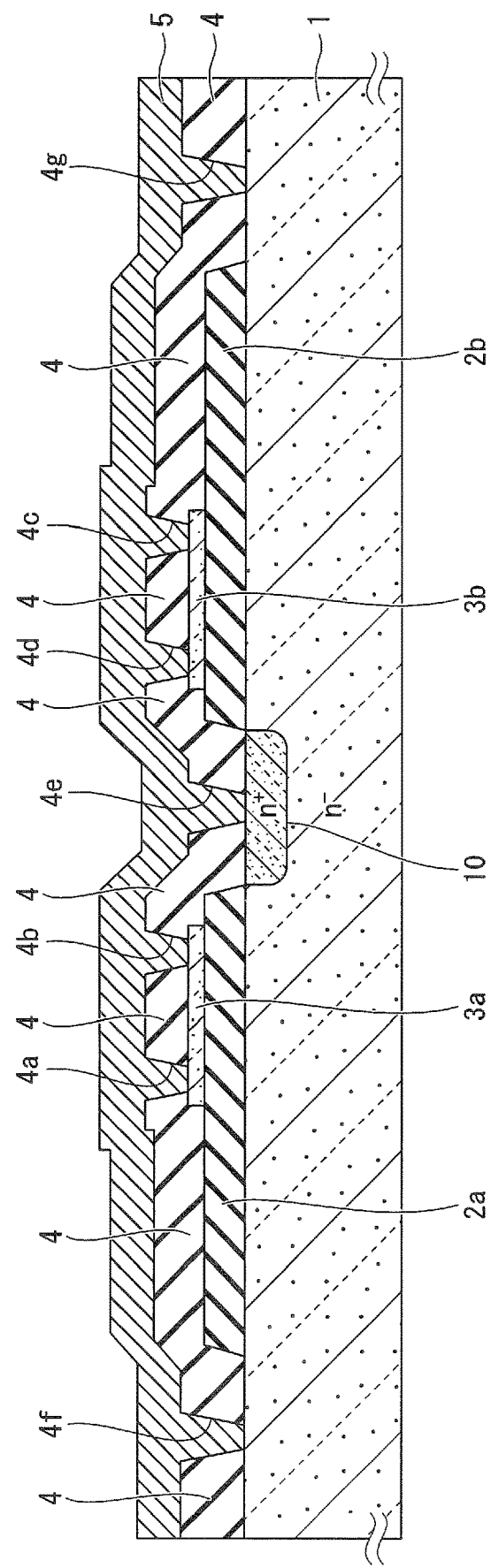
FIG. 15 is a cross-sectional view, continued from FIG. 14, illustrating the process of manufacturing the dummy element according to the embodiment of the present invention.
Figure 16:
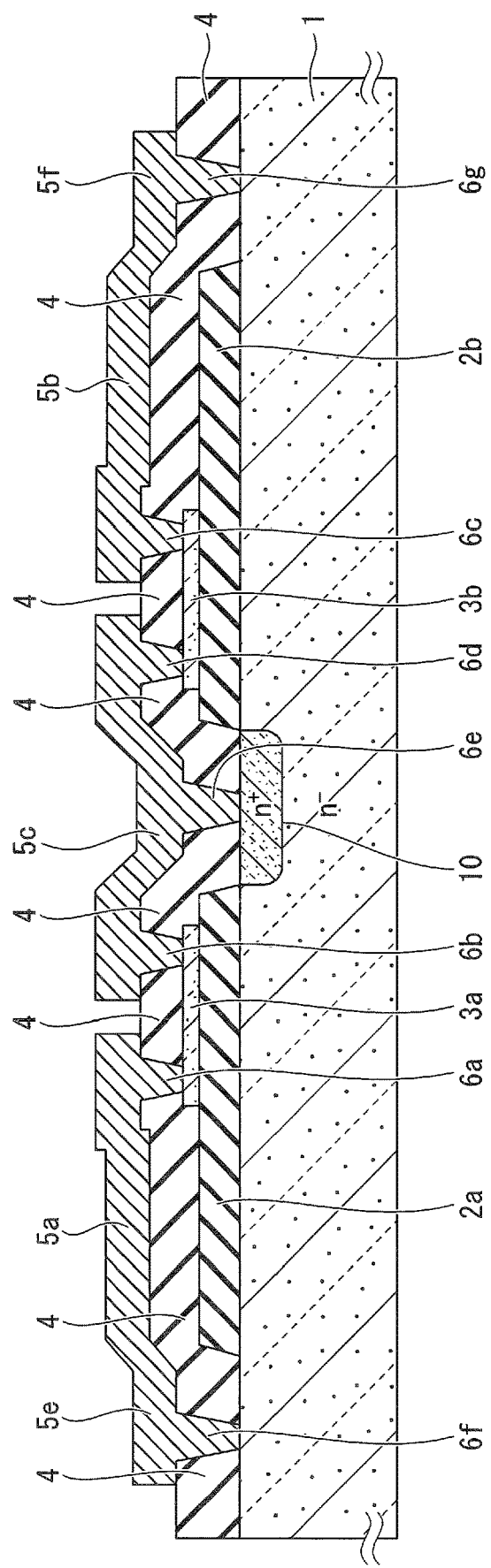
FIG. 16 is a cross-sectional view, continued from FIG. 15, illustrating the process of manufacturing the dummy element according to the embodiment of the present invention.

Next, as illustrated in FIG. 15, the metallic film 5 is deposited on the interlayer insulating film 4 to fill the contact holes 4a to 4g by vacuum evaporation or sputtering. The metallic film 5 may be made of a Ti/TiN film, an Al—Si film, and a TiN/Ti film sequentially stacked by a CVD method, for example. A photoresist film is then coated on the metallic film 5, and is delineated by photolithography. Using the delineated photoresist film as an etching mask, a part of the metallic film 5 is selectively removed, so as to form the first pad-forming electrode 5a, the second pad-forming electrode 5b, the relay wire 5c, and the extending portions 5e and 5f on the interlayer insulating film 4, as illustrated in FIG. 16. Although not shown in FIG. 16, the guard ring layer 5d having a ring-like shape divided at the extending portions 5e and 5f in the planar pattern as illustrated in FIG. 4 is also formed.

At the same time, the contact region 6a is formed to connect the first pad-forming electrode 5a to the first resistive layer 3a via the first contact hole 4a, and the contact region 6b is formed to connect the first pad-forming electrode 5a to the relay wire 5c via the second contact hole 4b. The contact region 6e is formed to connect the relay wire 5c to the semiconductor substrate 1 via the fifth contact hole 4e. The contact region 6c is formed to connect the second pad-forming electrode 5b to the second resistive layer 3b via the third contact hole 4c, and the contact region 6d is formed to connect the second pad-forming electrode 5b to the relay wire 5c via the forth contact hole 4d. The contact regions 6f and 6g are formed to connect the extending portions 5e and 5f to the semiconductor substrate 1 via the sixth contact hole 4f and the seventh contact hole 4g. The method of manufacturing the resistive element illustrated in FIG. 1 and FIG. 2 includes the same step as illustrated in FIG. 15. While the manufacturing method for the resistive element includes the step of forming the pair of the first pad-forming electrode 5a and the second pad-forming electrode 5b, the relay wire 5c, and the ring-shaped guard ring layer 5d on the interlayer insulating film 4, the manufacturing method does not include the step of forming the extending portions 5e and 5f as illustrated in FIG. 16.

Figure 17:
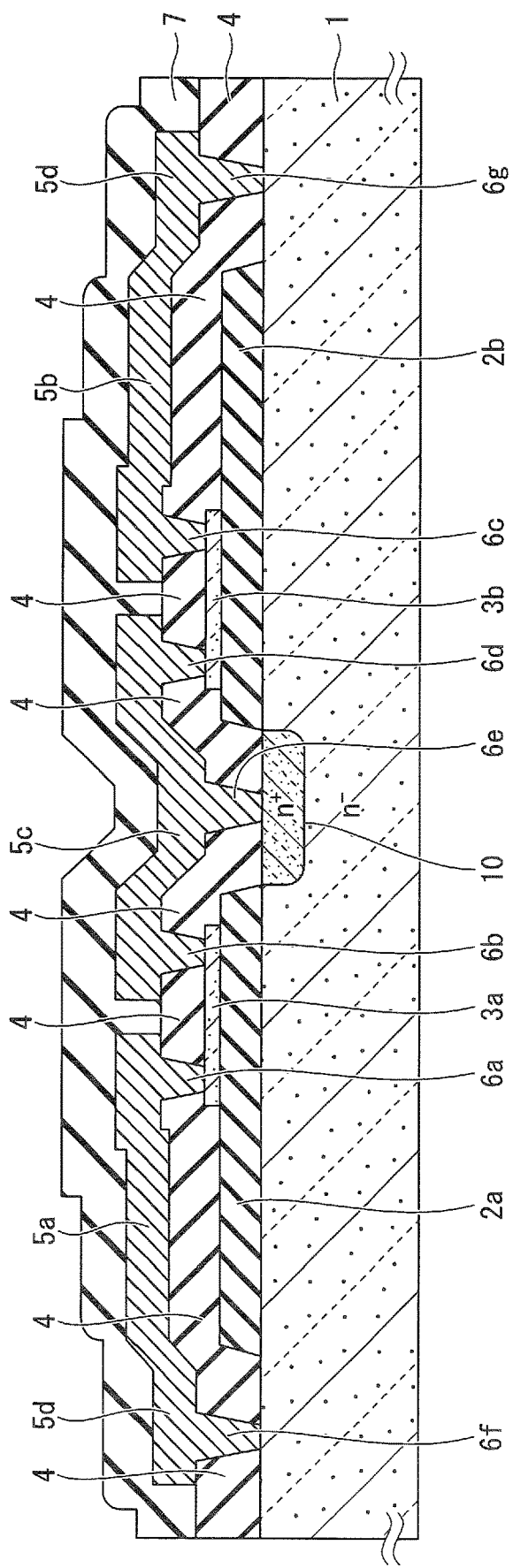
FIG. 17 is a cross-sectional view, continued from FIG. 16, illustrating the process of manufacturing the dummy element according to the embodiment of the present invention.
Figure 18:
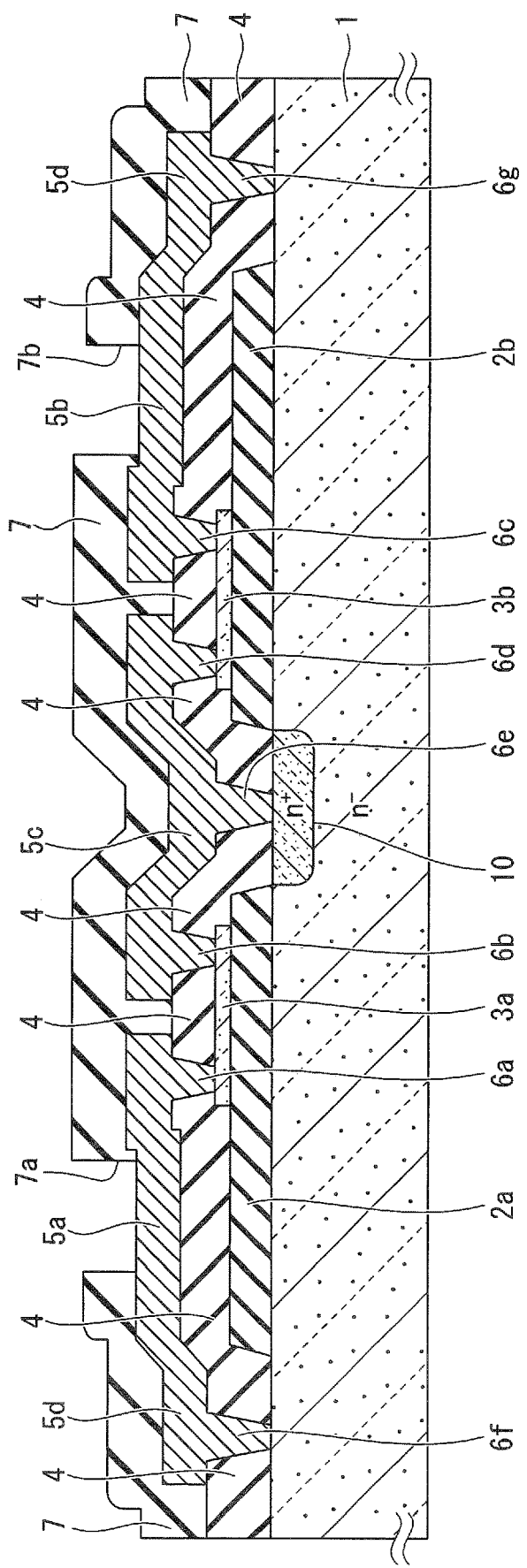
FIG. 18 is a cross-sectional view, continued from FIG. 17, illustrating the process of manufacturing the dummy element according to the embodiment of the present invention.

Next, as illustrated in FIG. 17, the passivation film 7 is formed on the first pad-forming electrode 5a, the second pad-forming electrode 5b, the relay wire 5c, the extending portions 5e and 5f, and the guard ring layer 5d. For example, the passivation film 7 including a TEOS film, a $Si_3N_4$ film, and a polyimide film is formed such that the TEOS film and the $Si_3N_4$ film are sequentially stacked, and the polyimide film is further coated on the stacked film by a plasma CVD method. A photoresist film is then coated on the passivation film 7, and is delineated by photolithography. Using the delineated photoresist film as an etching mask, a part of the passivation film 7 is selectively removed, so as to provide the first window 7a and the second window 7b in the passivation film 7 as illustrated in FIG. 18. The first pad-forming electrode 5a and the second pad-forming electrode 5b are partly exposed to the first window 7a and the second window 7b so as to define the pad regions for mounting. The method of manufacturing the resistive element illustrated in FIG. 1 and FIG. 2 includes the same steps as illustrated in FIG. 17 and FIG. 18.

Next, the bottom surface of the semiconductor substrate 1 is polished by chemical mechanical polishing (CMP) so as to decrease the thickness of the semiconductor substrate 1 to about 350 micrometers. The counter electrode 9 is then formed on the bottom surface of the semiconductor substrate 1 by vacuum evaporation or sputtering. A plurality of elements, each substantially corresponding to the resistive element illustrated in FIG. 1, are formed in chip regions arranged into a matrix form in a single wafer, and the dummy element as illustrated in FIG. 3 is formed in some of the chip regions. The chip regions are diced and divided into chips each corresponding to the resistive element as illustrated in FIG. 1 or the dummy element as illustrated in FIG. 3.

The method of manufacturing the dummy element according to the embodiment of the present invention described above facilitates the fabrication of the dummy element for simulating a defective state of the resistive element as illustrated in FIG. 1 and FIG. 2, without greatly differing from the manufacturing method for the resistive element illustrated in FIG. 1 and FIG. 2.

First Modified Example

Figure 19:
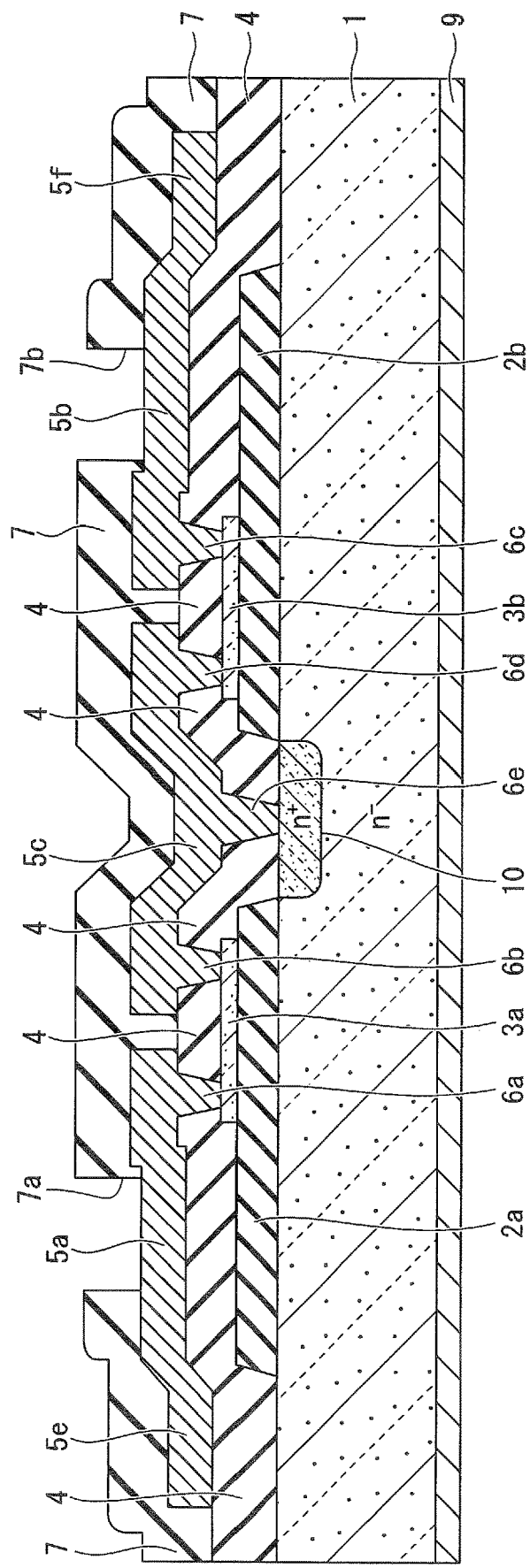
FIG. 19 is a cross-sectional view illustrating a resistive element according to a first modified example of the embodiment of the present invention.

A resistive element according to a first modified example of the embodiment of the present invention illustrated in the cross-sectional view of FIG. 19 differs from the resistive element illustrated in FIG. 1 in that neither the first peripheral contact region 11 nor the second peripheral contact region 12 appears in the semiconductor substrate 1. The resistive element according to the first modified example further differs from the resistive element illustrated in FIG. 1 in that the paired first pad-forming electrode 5a and second pad-forming electrode 5b further extend to define the extending portions 5e and 5f.

The resistive element according to the first modified example differs from the dummy element according to the embodiment of the present invention as illustrated in FIG. 3 only in excluding the contact regions 6f and 6g which electrically connect the extending portions 5e and 5f to the semiconductor substrate 1. The structure illustrated in FIG. 19 eliminating the contact regions 6f and 6g facilitates the fabrication of a dummy element functionally equivalent to the dummy element according to the embodiment of the present invention illustrated in FIG. 3 without the manufacturing method greatly changed.

Second Modified Example

Figure 20:
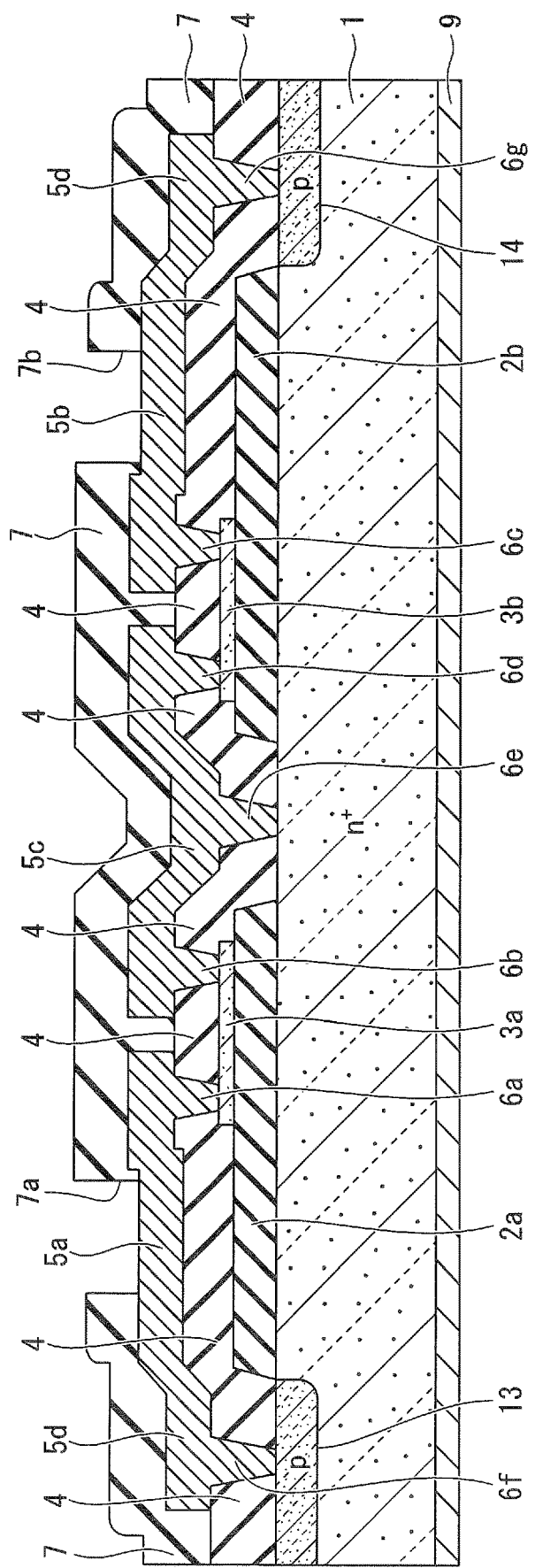
FIG. 20 is a cross-sectional view illustrating a dummy element according to a second modified example of the embodiment of the present invention.

A dummy element according to a second modified example of the embodiment of the present invention illustrated in FIG. 20 differs from the dummy element according to the embodiment of the present invention as illustrated in FIG. 3 in using, as the semiconductor substrate 1, a substrate having a low specific resistivity such as a silicon substrate doped with n-type impurity ions having a high concentration. The content of the resistive component of the semiconductor substrate 1 is preferably reduced to a level which can be ignored with respect to the resistive component of the first resistive layer 3a and the second resistive layer 3b. In particular, the content of the resistive component of the semiconductor substrate 1 is preferably about one hundredth or less of that of the first resistive layer 3a and the second resistive layer 3b. The specific resistivity of the semiconductor substrate 1 may be in a range from 2 to 60 mΩ·cm. Alternatively, the semiconductor substrate 1 may be a silicon substrate doped with p-type impurity ions having a high concentration, or may be made of material other than silicon. A first peripheral contact region 13 and a second peripheral contact region 14 of the conductivity type (p-type) opposite to that of the semiconductor substrate 1 are buried at upper portions of the semiconductor substrate 1.

The substrate connection terminal at the middle end (the third end) of the T-shaped relay wire 5c is connected to the semiconductor substrate 1 with an ohmic contact at low contact resistance via the contact region 6e. The extending portion 5e is in Schottky contact with the first peripheral contact region 13 of p-type buried in the semiconductor substrate 1 via the contact region 6f. The extending portion 5f is in Schottky contact with the second peripheral contact region 14 of p-type buried in the semiconductor substrate 1 via the contact region 6g.

The dummy element according to the second modified example of the embodiment of the present invention includes the semiconductor substrate 1 having a low specific resistivity, and further includes the first peripheral contact region 13 and the second peripheral contact region 14 of the conductivity type opposite to that of the semiconductor substrate 1 buried at the upper portions of the semiconductor substrate 1, so as to achieve the Schottky contact of the extending portions 5e and 5f with the first peripheral contact region 13 and the second peripheral contact region 14.

Third Modified Example

Figure 21:
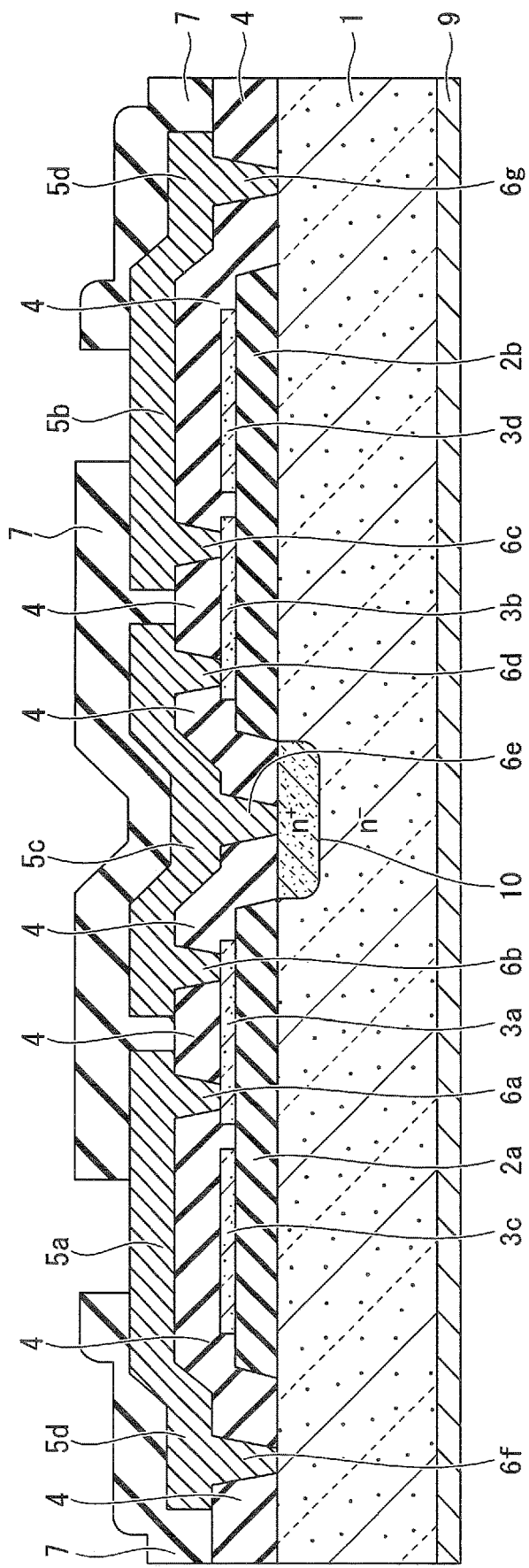
FIG. 21 is a cross-sectional view illustrating a dummy element according to a third modified example of the embodiment of the present invention.

A dummy element according to a third modified example of the embodiment of the present invention illustrated in FIG. 21 differs from the dummy element according to the embodiment of the present invention as illustrated in FIG. 3 in including a first auxiliary film 3c in a floating state in terms of potential allocated on the lower insulating film (2a, 2b) and separated from the first resistive layer 3a, and in including a second auxiliary film 3d in a floating state in terms of potential allocated on the lower insulating film (2a, 2b) and separated from the second resistive layer 3b. Although not shown, the resistive element as a target to be simulated by the dummy element according to the third modified example may have a structure illustrated in FIG. 1 and further including the first auxiliary film 3c and the second auxiliary film 3d as illustrated in FIG. 21.

The first auxiliary film 3c is deposited under the first pad-forming electrode 5a and is separated from the first resistive layer 3a. The second auxiliary film 3d is deposited under the second pad-forming electrode 5b and is separated from the second resistive layer 3b. The first auxiliary film 3c and the second auxiliary film 3d include the same material as the first resistive layer 3a and the second resistive layer 3b, such as n-type DOPOS, and have the same thickness as the first resistive layer 3a and the second resistive layer 3b. The first auxiliary film 3c and the second auxiliary film 3d have a rectangular planar pattern, for example. The other configurations of the dummy element according to the third modified example are the same as those of the dummy element illustrated in FIG. 3, and overlapping explanations are not repeated below.

The dummy element according to the third modified example includes the first auxiliary film 3c and the second auxiliary film 3d in a floating state so as to reduce the parasitic capacitance under the pair of the first pad-forming electrode 5a and the second pad-forming electrode 5b, as in the case of increasing the thickness of the lower insulating film (2a, 2b). The dummy element according to the third modified example thus can avoid a decrease in the total resistance in response to a reduction in impedance during operation at a high frequency so as to prevent oscillation.

A method of manufacturing the dummy element according to the third modified example may include a step of forming the first auxiliary film 3c and the second auxiliary film 3d simultaneously with the first resistive layer 3a and the second resistive layer 3b by selectively removing the DOPOS layer 3, as described in the step illustrated in FIG. 12. The other steps of the method of manufacturing the dummy element according to the third modified example are the same as those of the manufacturing method for the dummy element according to the embodiment described above, and overlapping explanations are not repeated below.

Other Embodiments

While the present invention has been described above by reference to the embodiment, it should be understood that the present invention is not intended to be limited to the descriptions of the Specification and the drawings composing part of this disclosure. Various alternative embodiments, examples, and technical applications will be apparent to those skilled in the art according to this disclosure.

While the embodiment of the present invention has been illustrated with the resistive element and the dummy element each including both the first resistive layer 3a and the second resistive layer 3b in one chip as illustrated in FIG. 1 and FIG. 3, each chip may be provided with a single resistive layer. For example, the resistive element and the dummy element as illustrated in FIG. 1 and FIG. 3 may eliminate the structure on the right side including the lower insulating film 2b, the second resistive layer 3b, and the second pad-forming electrode 5b. Alternatively, the resistive element and the dummy element according to the embodiment of the present invention may include three or more resistive layers in a single chip.

While the embodiment of the present invention has been illustrated with the case of using the resistive element and the dummy element as the pair of the gate resistors R1 to R12, as illustrated in FIG. 6, the resistive element and the dummy element are not limited to be used as the gate resistors R1 to R12, and may each be used as a resistive element for various types of integrated circuit (IC).

What is claimed is:
1. A dummy element for simulating a defective state of a resistive element of a target to be examined, the dummy element comprising:
   a semiconductor substrate;
   a lower insulating film deposited on the semiconductor substrate;
   a first resistive layer deposited on the lower insulating film;
   an interlayer insulating film covering the first resistive layer;
   a first pad-forming electrode, deposited on the interlayer insulating film, having a contact portion directly connected to the first resistive layer, and an extending portion separate from the contact portion in Schottky contact with the semiconductor substrate so as to cause a short circuit between the first pad-forming electrode and the semiconductor substrate to simulate a Schottky contact state;
   a relay wire connected on one side to the first resistive layer and connected at another portion to the semiconductor substrate with an ohmic contact; and
   a counter electrode allocated under the semiconductor substrate,
   wherein
   the Schottky contact state corresponds to a state in which a corresponding lower insulating film of the resistive element and a corresponding interlayer insulating film of the resistive element are defective.

2. The dummy element of claim 1, wherein a contact region with a conductivity type identical to the semiconductor substrate and having a higher impurity concentration than the semiconductor substrate, is buried at an upper portion of the semiconductor substrate to which the relay wire is connected with the ohmic contact.

3. The dummy element of claim 1, wherein a contact region with a conductivity type opposite to the semiconductor substrate, is buried at an upper portion of the semiconductor substrate with which the extending portion of the first pad-forming electrode is in Schottky contact.

4. The dummy element of claim 1, further comprising:
   a second resistive layer deposited on the lower insulating film and covered with the interlayer insulating film; and a second pad-forming electrode deposited on the interlayer insulating film so as to be connected to another side of the relay wire and the second resistive layer, and including an extending portion to be in Schottky contact with the semiconductor substrate so as to cause a short circuit between the second pad-forming electrode and the semiconductor substrate to simulate the Schottky contact state.

5. The dummy element of claim 1, further comprising:
a passivation film deposited on the first pad-forming electrode and the relay wire, the passivation film including a window to expose a portion of the first pad-forming electrode, and
the window defines a pad region of the first pad-forming electrode through which a bonding wire is bondable.

6. The dummy element of claim 1, wherein the first resistive layer is connected to the semiconductor substrate in series via the relay wire and is configured to serve as a resistor between the first pad-forming electrode and the counter electrode.

7. The dummy element of claim 1, wherein the one side of the relay wire is directly connected to the first resistive layer.

8. The dummy element of claim 1, wherein the contact portion of the first pad-forming electrode is directly connected to the first resistive layer at a location spaced apart from a location at which the one side of the relay wire is directly connected to the first resistive layer.

9. The dummy element of claim 8, wherein the interlayer insulating film is disposed between the location at which the contact portion of the first pad-forming electrode is directly connected to the first resistive layer and the location at which the one side of the relay wire is directly connected to the first resistive layer.

10. The dummy element of claim 1, further comprising a contact region with a conductivity type identical to the semiconductor substrate and having a higher impurity concentration than the semiconductor substrate, buried at an upper portion of the semiconductor substrate,
wherein the another portion of the relay wire is connected to the contact region with the ohmic contact, and
a width of the another portion of the relay wire is less than a width of the contact region such that the relay wire is only ohmically contacted with the contact region.

11. The dummy element of claim 1, further comprising a contact region with a conductivity type opposite to the semiconductor, buried at an upper portion of the semiconductor substrate,
wherein the extending portion of the first pad-forming electrode is in Schottky contact with the contact region so as to cause the short circuit between the first pad-forming electrode and the semiconductor substrate to simulate the Schottky contact state, and
a width of the extending portion is less than a width of the contact region such that at an interface between the extending portion and the semiconductor substrate, the extending portion is only in contact with the contact region.

12. The dummy element of claim 8, further comprising an auxiliary film to reduce a parasitic capacitance below the first pad-forming electrode, the auxiliary film being deposited on the lower insulating film and being disposed below the first pad-forming electrode and spaced apart from the first resistive layer.

13. A method of examining a defect of a resistive element of a target, using a dummy element including a lower insulating film deposited on a semiconductor substrate, a first resistive layer deposited on the lower insulating film, an interlayer insulating film covering the first resistive layer, a first pad-forming electrode deposited on the interlayer insulating film and having a contact portion in direct contact with the first resistive layer and an extending portion to be in Schottky contact with the semiconductor substrate so as to cause a short circuit between the first pad-forming electrode and the semiconductor substrate to simulate a Schottky contact state, a relay wire connected to the first resistive layer and connected to the semiconductor substrate with an ohmic contact, and a counter electrode allocated under the semiconductor substrate, the method comprising:
measuring an electrical characteristic between the first pad-forming electrode and the counter electrode, to obtain a first measurement result;
measuring an electrical characteristic of the resistive element of the target, to obtain a second measurement result; and
detecting whether a defect exists with respect to at least one of a corresponding lower insulating film of the resistive element and a corresponding interlayer insulating film of the resistive element, based on the first measurement result and the second measurement result.

14. The method of examining the defect of the resistive element of claim 13, wherein measuring the electrical characteristic includes an impedance measurement.

15. The method of examining the defect of the resistive element of claim 13, wherein measuring the electrical characteristic includes an I-V measurement.

16. A dummy element for simulating a defective state of a resistive element of a target to be examined, the dummy element comprising:
a semiconductor substrate;
a lower insulating film deposited on the semiconductor substrate;
a first resistive layer deposited on the lower insulating film;
a second resistive layer deposited on the lower insulating film;
an interlayer insulating film covering the first resistive layer and the second resistive layer;
a first pad-forming electrode deposited on the interlayer insulating film so as to be connected to the first resistive layer, and including an extending portion in Schottky contact with the semiconductor substrate so as to cause a short circuit between the first pad-forming electrode and the semiconductor substrate to simulate a Schottky contact state;
a second pad-forming electrode deposited on the interlayer insulating film so as to be connected to another side of the relay wire and the second resistive layer, and including an extending portion to be in Schottky contact with the semiconductor substrate so as to cause a short circuit between the second pad-forming electrode and the semiconductor substrate to simulate the Schottky contact state;
a relay wire connected on one side to the first resistive layer and connected to the semiconductor substrate with an ohmic contact; and
a counter electrode allocated under the semiconductor substrate,
wherein
the Schottky contact state corresponds to a state in which a corresponding lower insulating film of the resistive element and a corresponding interlayer insulating film of the resistive element are defective.

* * * * *